(12) United States Patent
Tsuboi

(10) Patent No.: US 6,420,229 B2
(45) Date of Patent: Jul. 16, 2002

(54) METHOD FOR FABRICATING A CYLINDRICAL CAPACITOR IN WHICH A STORAGE ELECTRODE IS FORMED ON BOTH THE UPPER AND SIDE SURFACES OF A CONDUCTOR PLUG

(75) Inventor: Osamu Tsuboi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/774,098

(22) Filed: Jan. 31, 2001

Related U.S. Application Data

(63) Continuation of application No. 09/123,982, filed on Jul. 29, 1998, now Pat. No. 6,207,988.

(30) Foreign Application Priority Data

Feb. 10, 1998 (JP) .............................................. 10-28241

(51) Int. Cl.[7] ................. H01L 21/8242; H01L 21/8234; H01L 21/8249
(52) U.S. Cl. ....................... 438/253; 438/238; 438/396
(58) Field of Search ................................. 438/253, 238, 438/239, 396, 284

(56) References Cited

U.S. PATENT DOCUMENTS

| | | | |
|---|---|---|---|
| 5,401,681 A | 3/1995 | Dennison | 437/60 |
| 5,418,180 A * | 5/1995 | Brown | 438/398 |
| 5,874,756 A | 2/1999 | Ema et al. | 257/296 |
| 5,940,702 A | 8/1999 | Sakao | 438/254 |
| 5,981,331 A | 11/1999 | Tsunemine | 438/240 |
| 6,080,621 A * | 6/2000 | Wang et al. | 438/253 |

* cited by examiner

Primary Examiner—Richard Elms
Assistant Examiner—Beth E. Owens
(74) Attorney, Agent, or Firm—Armstrong, Westerman & Hattori, LLP

(57) ABSTRACT

The semiconductor device comprises a base substrate, a wiring 54 formed on the base substrate, a first insulating film 48, 56 for covering the upper surface and the side surfaces of the wiring 54, an etching stopper film 58 formed on the base substrate and the first insulating film 48, 56, a conductor plug 36b connected to the base substrate through the etching stopper film 58 and projected upper of the base substrate, and a capacitor 79 having one electrode 68 connected to the upper surface and the side surfaces of the conductor plug 36b. The electrode 68 is formed not only on the upper surface of the conductor plug 36b but also on the side walls thereof, whereby the electrode 68 can be fixed to the conductor plug 36b without failure. The electrode 68 is formed not only on the upper surface of the conductor plug 36b but also on the side surfaces thereof in the vicinity of the conductor plug 36b, whereby the electrode 68 can have a large surface area in the vicinity of the side surfaces of the conductor plug 36b. This enables the electrode 68 to be reduced in height.

7 Claims, 23 Drawing Sheets

METHOD FOR FABRICATING A CYLINDRICAL CAPACITOR IN WHICH A STORAGE ELECTRODE IS FORMED ON BOTH THE UPPER AND SIDE SURFACES OF A CONDUCTOR PLUG

This application is a continuation of prior application Ser. No. 09/123,982 filed Jul. 29, 1998 now U.S. Pat. No. 6,207,980.

BACKGROUND OF THE INVENTION

The present invention relates to a semiconductor device and a method for fabricating the semiconductor device, more specifically a semiconductor device including capacitors and a method for fabricating the semiconductor device.

A DRAM (Dynamic Random Access Memory) comprises memory cells each including one transfer transistor and one capacitor and may only have a small area, and is a semiconductor memory suitable for mass storage. With recent increased information processing amounts of electronic equipments, etc. DRAMs used in the electronic equipments, etc. are required to be further micronized and have larger capacities.

A conventional method for fabricating a DRAM will be explained with reference to FIGS. 19A to 23B. In FIGS. 19A to 23B, the drawings shown on the left side are sectional views of the DRAM along a bit line of the DRAM, and those on the right side are sectional views along a word line of the DRAM.

As shown in FIG. 19A, first, a device isolation film 112 is formed on a silicon substrate 110 by LOCOS (LOCal Oxidation of Silicon).

Then, a gate oxide film (not shown) is formed on the surface of the silicon substrate 110.

Next, a polysilicon film 114, a tungsten silicide film 116, a silicon oxide film 118, a silicon nitride film 120 and a silicon nitride oxide film 122 are formed sequentially on the entire surface by CVD (Chemical Vapor Deposition) to form a laminated film 123 (see FIG. 19B).

Then, the laminated film 123 is patterned as required to form a gate electrode 124 of a polycide structure of the polysilicon film 114 and the tungsten silicide film 116. The gate electrode 124 functions as word lines which also function as gate electrodes of other transfer transistors which are extended vertically to the sheet of the drawing on the left side of FIG. 19C.

Next, with the laminated film 123 as a mask dopant ions are implanted into the silicon substrate 110 to form a source/drain diffused layer 126a, 126b by self-alignment with the laminated film 123 (see FIG. 19C).

Then, a silicon nitride film is formed on the entire surface and is anisotropically etched to expose the surfaces of the silicon substrate 110, the device isolation film 112 and the laminated film 123 to form a sidewall insulating film 128 on the sidewalls of the laminated film 123.

Then, a stopper film 130 of a silicon nitride film is formed on the entire surface.

Next, an inter-layer insulating film 132 of an about 0.5 µm-thickness BPSG (Boro-Phospho-Silicate Glass) film is formed by CVD. The surface of the inter-layer insulating film 132 is planarized by reflow and CMP (Chemical Mechanical Polishing) (see FIG. 19D).

Then, a contact hole 134 for exposing the source/drain diffused layer 126b is formed by self-alignment with the sidewall insulating film 128 (see FIG. 20A).

Next, a conductor plug 136a is formed in the contact hole 134 (see FIG. 20B).

Then, an about 0.1 µm-thickness silicon oxide film 138 is formed on the entire surface by CVD.

Then, a contact hole 140 for exposing the source-drain diffused layer 126a is formed by self-alignment with the sidewall insulating film 128 (see FIG. 21A).

Next, a polysilicon film 142, a tungsten silicide film 144, a silicon oxide film 146, a silicon nitride film 148 and a silicon nitride oxide film 150 are sequentially formed on the entire surface by CVD to form a laminated film 152 of these films. Then, the laminated film 152 is patterned as required to form a bit line 154 of a polycide structure of the polysilicon film 142 and the tungsten silicide film 144 (see FIG. 21B).

Then, a silicon nitride film is formed on the entire surface and is anisotropically etched until the surfaces of the silicon oxide film 138 and the laminated film 152 are exposed to form a sidewall insulating film 156 on the sidewalls of the laminated film 152. The sidewall insulating film 156 is for formation of a SAC (Self aligned Contact) so as to secure a large disalignment margin of micronized contact.

Next, an inter-layer insulating film 160 is formed on the entire surface. Then, the surface of the inter-layer insulating film 160 is planarized by CMP. Next, a silicon nitride film 161 is formed on the inter-layer insulating film 160 by CVD (see FIG. 21C).

Subsequently, a contact hole 162 for exposing the upper surface of the conductor plug 136a is formed. Then, a conductor plug 136b is formed in the contact hole 162 (see FIG. 22A).

Next, an about 1.7 µm-thickness BPSG film 164 is formed on the entire surface by CVD. An opening 166 for exposing the upper surface of the conductor plug 136b is formed in the BPSG film 164. The opening 166 is for formation of a storage electrode 168 of a capacitor in a later step (see FIG. 23A). At this time the silicon nitride film 161 functions as etching stopper (see FIG. 22B).

Then an about 0.05 µm-thickness polysilicon film is formed on the entire surface by CVD. Next, a resist is applied to the entire surface to form a resist film 170. Then, the polysilicon film and the resist film 170 are polished by CMP until the surface of the BPSG film 164 is exposed. The storage electrode 168 is thus formed of the polysilicon film inside the opening 166.

Subsequently, the BPSG film 164 is removed by HF-based wet etching. At this time the silicon nitride film 161 functions as an etching stopper (see FIG. 23A).

Then, the resist film 170 remaining on the inside of the storage electrode 168 is removed by ashing. Then, an about 8 nm-thickness tantalum oxide film 172 is formed on the entire surface by CVD. The tantalum oxide film 172 functions as a dielectric of a capacitor. Then, an 0.05 µm-thickness titanium nitride film 174 and a 0.1 µm-thickness polysilicon film 176 are sequentially formed by CVD to form an opposed electrode 177 of a capacitor, which is formed of the titanium nitride film 174 and the polysilicon film 176 (see FIG. 23B).

Thus the conventional DRAM having the capacitor connected to the transfer transistor is fabricated.

However, in the conventional DRAM fabrication method, because close contact between the storage electrode 168 and the conductor plug 136b cannot be sufficiently secured, in removing the BPSG film 164 by HF-based wet etching, the storage electrode 168 is released from the conductor plug

136b, or the etchant intrudes at a vicinity of the upper surface of the conductor plug 136b to adversely etch regions which are not to be etched. Resultantly the DRAM has low yields.

To further micronize the DRAM, it is necessary to retain a capacity of the capacitor substantially equal to the conventional capacitor that the capacitor has an increased height, which leads to a larger step with respect to the peripheral circuit region. This results in a problem that it is difficult to form openings of the contact holes and the wiring.

SUMMARY OF THE INVENTION

An object of the present invention is to provide a semiconductor device and a method for fabricating the same which give high yields and which enable the device to retain a low capacitor height.

The above-described object is achieved by a semiconductor device comprising: a base substrate; a wiring formed on the base substrate; a first insulating film covering an upper surface and a side surface of the wiring; an etching stopper film formed on the base substrate and the first insulating film; a conductor plug connected to the base substrate through the etching stopper film and projected upward of the base substrate; and a capacitor having one electrode connected to an upper surface and a side surface of the conductor plug. Because one electrode of a capacitor is connected not only to the upper surface of the conductor plug but also to the side surfaces thereof, one electrode of the capacitor can be securely fixed to the conductor plug. One electrode of the capacitor is formed not only on the upper surface of the conductor plug but also on the side surfaces thereof, and one electrode of the capacitor can have a large surface area near the side surfaces of the conductor plug, whereby one electrode of the capacitor can be reduced in height and accordingly the capacitor can be reduced in height.

In the above-described semiconductor device it is preferable that the wiring is a word line, and which further comprises a second insulating film covering the capacitor, and a bit line formed on the second insulating film.

In the above-described semiconductor device it is preferable that the wiring is a bit line, and the bit line being connected to one of a source/drain diffusion layer of a transfer transistor formed on the base substrate.

In the above-described semiconductor device it is preferable that said one electrode of the capacitor is connected to the other of the source/drain diffusion layer of the transfer transistor through the conductor plug of the same conductor layer.

In the above-described semiconductor device it is preferable that said one electrode of the capacitor is formed spaced from the etching stopper film.

In above-described semiconductor device it is preferable that the capacitor is a cylindrical capacitor.

In the above-described semiconductor device it is preferable that a recess is formed in an upper surface of the conductor plug; and said one electrode of the capacitor is connected to the conductor plug inside the recess. Because said one electrode of the capacitor is connected to the conductor plug inside the recess, whereby said one electrode of the capacitor can be securely fixed to the conductor plug.

The above-described object is achieved by a method for fabricating a semiconductor device comprising the steps of: forming a wiring on a base substrate, the wiring having a first insulating film formed on an upper surface and a side surface thereof; forming a second insulating film on the base substrate and the wiring; forming a third insulating film on the second insulating film, the third insulating film having etching characteristics different from those of the second insulating film; forming a contact hole in the second insulating film and the third insulating film, the contact hole reaching the base substrate; forming a conductor plug inside the contact hole; forming a fourth insulating film on the third insulating film and the conductor plug, the fourth insulating film having etching characteristics different from those of the second insulating film; forming an opening in the third insulating film and the fourth insulating film in a region including a region with the conductor plug formed in; forming a storage electrode on an inside surface of the opening and connected to the conductor plug on an upper surface and a side surface of the conductor plug; and etching the third insulating film and the fourth insulating film with the second insulating film as an etching stopper. Because the storage electrode is formed not only on the upper surface of the conductor plug but also on the side surfaces thereof, the storage electrode is securely fixed to the conductor plug. The storage electrode can be prevented from releasing from the conductor plug by etching. Because the storage electrode is securely fixed to the conductor plug, etchant does not intrude into the region not to be etched, whereby the semiconductor can be fabricated at higher yields. Because the storage electrode is formed not only on the upper surface but also on the side surfaces thereof, the storage electrode can have a large area near the conductor plug, and the storage electrode can be reduced in height. Accordingly the capacitor can be reduced in height.

In the above-described method for fabricating the semiconductor device it is preferable that in the step of forming the contact hole, the contact hole is formed by self-alignment with the wiring.

In the above-described method for fabricating the semiconductor device it is preferable that the step of forming the contact hole includes a step of etching the third insulating film at a high selection ratio with respect to the second insulating film and a step of etching the second insulating film exposed in the contact hole.

In the above-described method for fabricating the semiconductor device it is preferable that in the step of forming the conductor plug, the conductor plug having a recess in an upper surface thereof is formed. Because the conductor plug having a recess in an upper surface thereof is formed, whereby the storage electrode can be securely fixed to the conductor plug.

In the above-described method for fabricating the semiconductor device it is preferable that in the step of forming the contact hole, the contact hole reaches a source/drain diffusion layer of a transfer transistor formed on the base substrate, and in the step of forming the conductor plug, the conductor plug is formed in the contact hole, arriving at the source/drain diffusion layer.

In the above-described method for fabricating the semiconductor device it is preferable that further comprising the steps of: forming a capacitor, which includes the storage electrode as one electrode, and forming a bit line above the capacitor, the bit line being spacing from the capacitor.

DETAILED DESCRIPTION OF THE INVENTION

[A First Embodiment]

Figure 1:
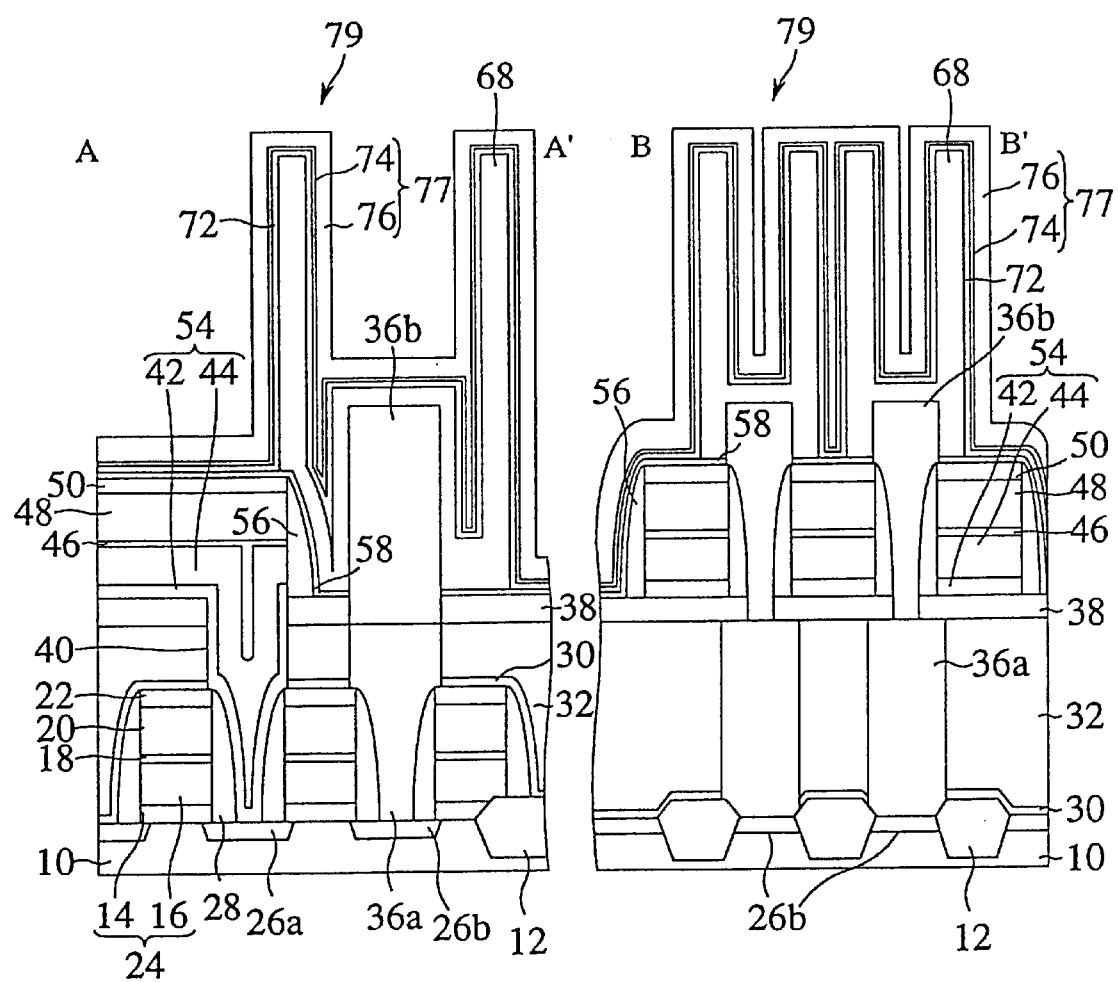
FIG. 1 is a sectional view of the semiconductor device according to a first embodiment of the present invention, which shows a structure thereof.
Figure 2:
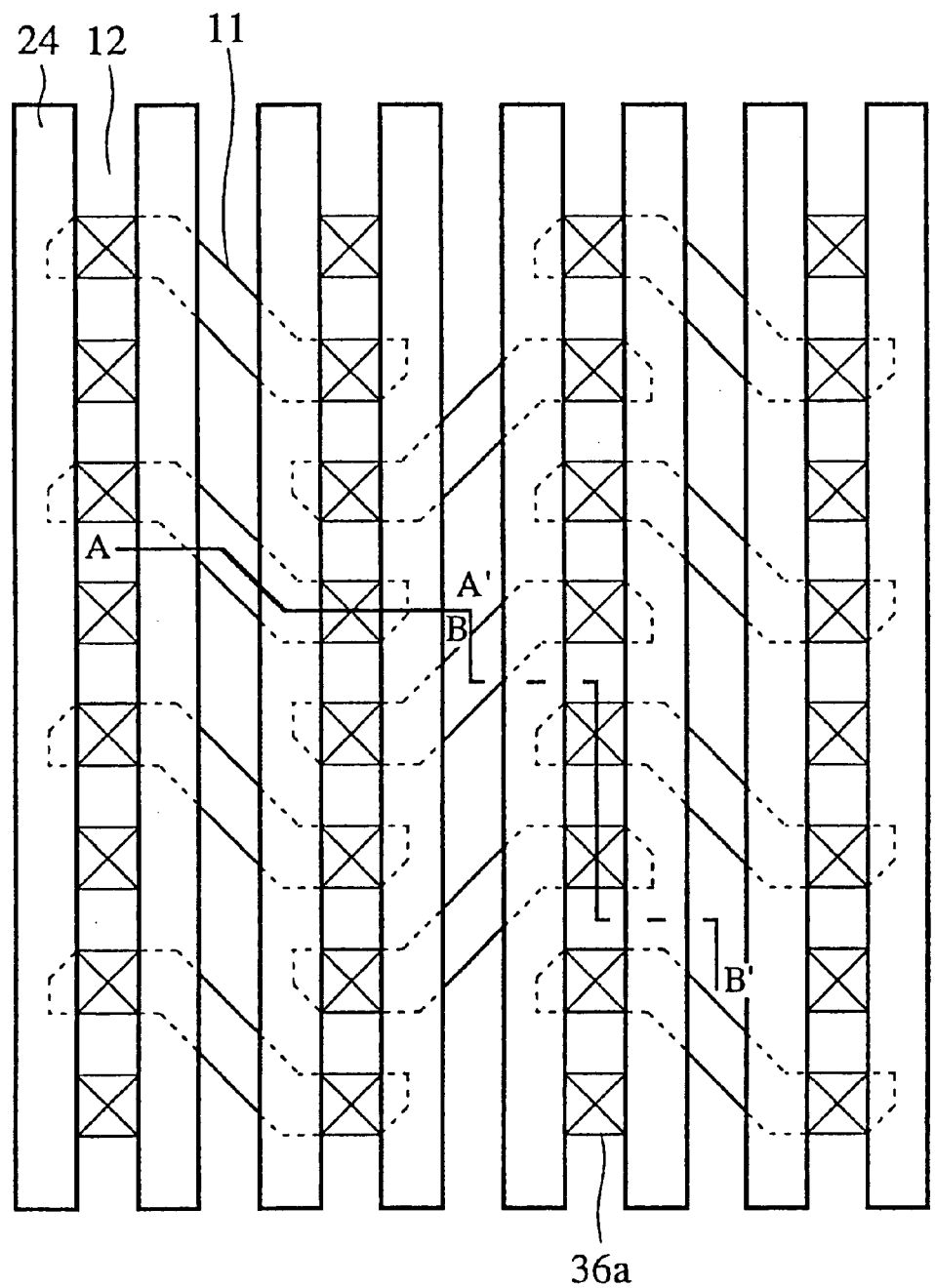
FIG. 2 is a plan view of the semiconductor device according to the first embodiment of the present invention.
Figure 3:
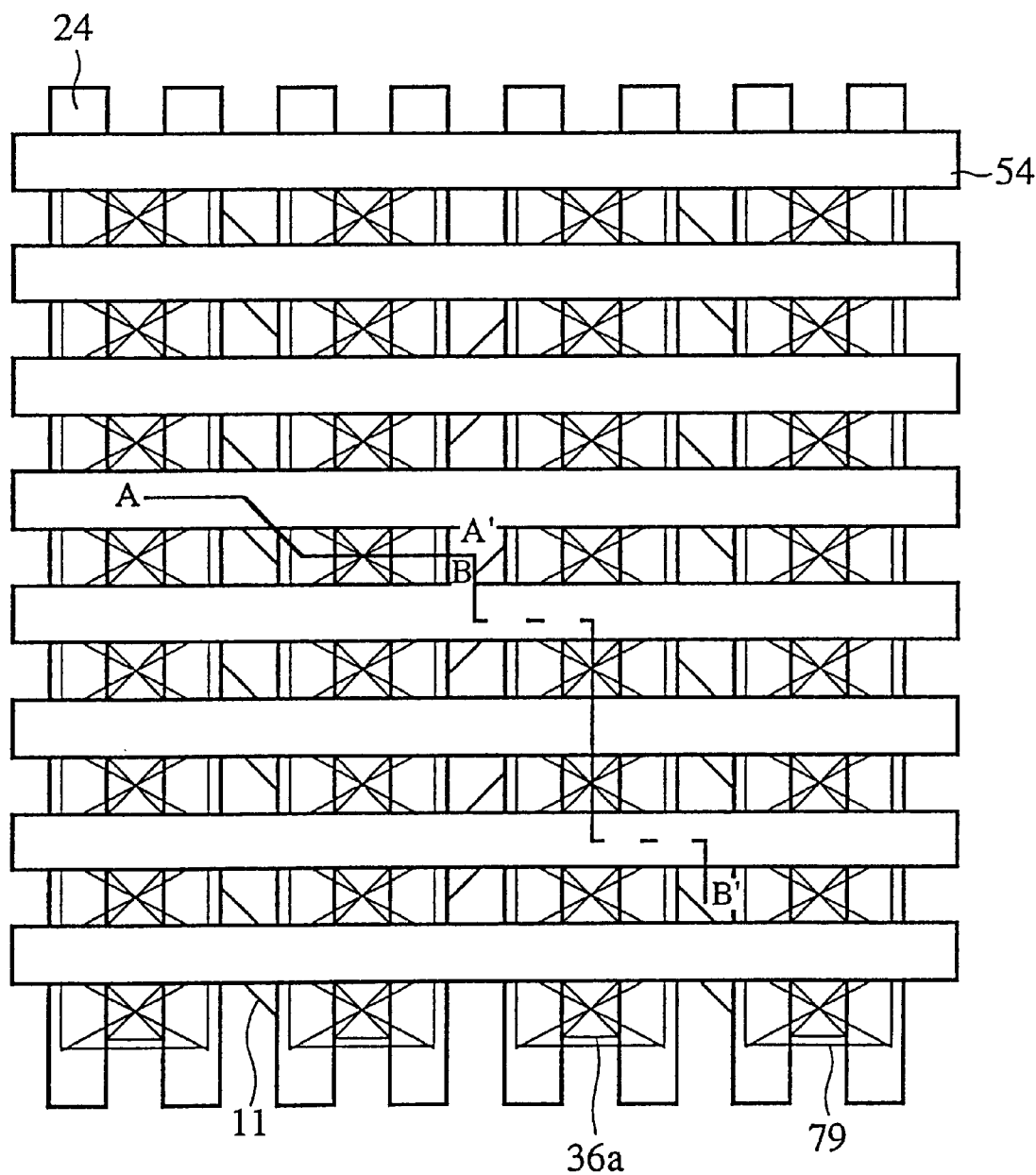
FIG. 3 is another plan view of the semiconductor device according to the first embodiment of the present invention.

The semiconductor device and the method for fabrication the same according to the first embodiment will be explained with reference to FIGS. 1 to 8B. FIG. 1 is a sectional view of the semiconductor device according to the present embodiment, which shows a structure thereof. FIG. 2 is a plan view of the semiconductor device according to the present embodiment. FIG. 3 is another plan view of the semiconductor device according to the present embodiment. FIGS. 4A to 8B are sectional views of the semiconductor device according to the present embodiment in the steps of the method for fabricating the same, which show the method. The semiconductor device according to the present embodiment is a DRAM. The views of FIG. 1 and FIGS. 3 to 8B on the left sides of the drawing sheets are sectional views along the line A-A' in FIGS. 2 and 3, i.e., sectional views along a bit line of the DRAM, and the views on the right sides of the drawing sheets are sectional views along the line B-B' in FIGS. 2 and 3, i.e., sectional views along a word line of the DRAM.

[The Semiconductor Device]

The semiconductor device according to the present embodiment will be explained with reference to FIGS. 1 to 3.

A shown in FIG. 1, a device isolation film 12 for defining a device region 11 (see FIG. 2) is formed on the surface of a silicon substrate 10, and in the defined device region 11 a transfer transistor including a gate electrode 24 extended vertically as viewed in the drawing on the left side of FIG. 1 and a source/drain diffusion layer 26a, 26b is formed. The gate electrode 24 of the transfer transistor has a polycide structure of a polysilicon film 14 and a tungsten silicide film 16 and functions as word lines which function as gate electrodes of other transfer transistors (see FIG. 2). On the gate electrode 24 a silicon oxide film 18, a silicon nitride film 20, a silicon nitride oxide film 22 are sequentially laid one on another. A sidewall insulating film 28 is formed on the side walls of the gate electrode 24 and of the laminated films 18, 20, 22. The transfer transistor is covered with a stopper film 30, an inter-layer insulating film 32 and a silicon oxide film 38 laid one on another.

On the silicon oxide-film 38 a bit line 54 connected to one side of the source/drain diffusion layer 26a of the transfer transistor through a contact hole 40 and extended horizontally as viewed in the drawing on the left side of FIG. 1 is formed (see FIG. 3). The bit line 54 has a polycide structure of a polysilicon film 42 and a tungsten silicide film 44, and a silicon oxide film 46, a silicon nitride film 48 and a silicon nitride oxide film 50 are laid on the bit line 54 sequentially one on another. A sidewall insulating film 56 is formed on the side walls of the bit line 54 and of the laminated films 46, 48, 50. The sidewall insulating film 56 and the silicon oxide film 38 are covered with a stopper film 58.

On the other hand, conductor plugs 36a, 36b extended upward are connected to the other side of the source/drain diffusion layer 26b. A storage electrode 68 is connected to the upper surface and side surfaces of the conductor plug 36b projected beyond the stopper film 58. A capacitor 79 comprises the storage electrode 68, a tantalum oxide film 72 which functions as a dielectric, and an opposed electrode 77. The opposed electrode 77 is formed of a titanium nitride film 74 and a polysilicon film 76.

As described above, according to the present embodiment, the storage electrode 68 is formed not only on the upper surface of the conductor plug 36b but also on the side walls thereof, whereby the storage electrode 68 can be fixed to the conductor plug 36b without failure. This produces in the method for fabricating the semiconductor device merits which will be described later.

According to the present embodiment, the storage electrode 68 is formed not only on the upper surface of the conductor plug 36b but also on the side surfaces thereof in the vicinity of the conductor plug 36b, whereby the storage electrode 68 can have a large surface area in the vicinity of the side surfaces of the conductor plug 36b. This enables the storage electrode 68 to be reduced in height.

[The Method for Fabricating the Semiconductor Device]

Next, the method for fabricating the semiconductor device according to the present embodiment will be explained with reference to FIGS. 4A to 8B.

Figure 4A:
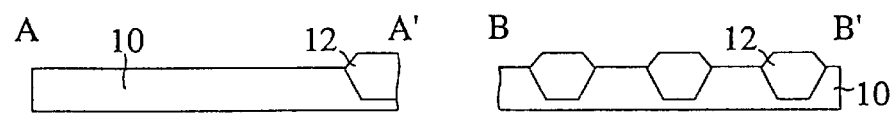
FIGS. 4A to 4D are sectional views of the semiconductor device according to the first embodiment, which show the method for fabricating the same (Part 1).

As shown in FIG. 4A, the device isolation film 12 is formed on the surface of the silicon substrate 10 by LOCOS. Then, the gate oxide film (not shown) is formed on the surface of the silicon substrate 10.

Figure 4B:
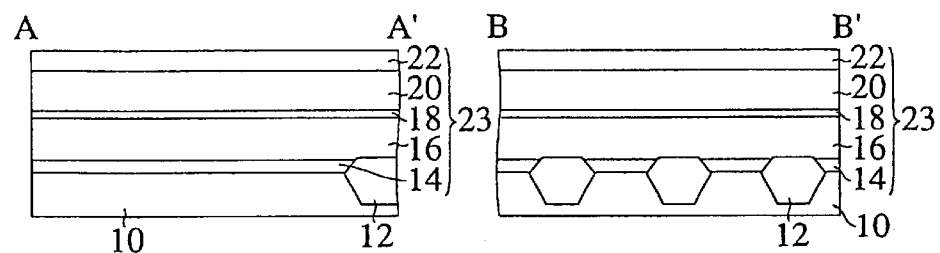
Figure 4C:
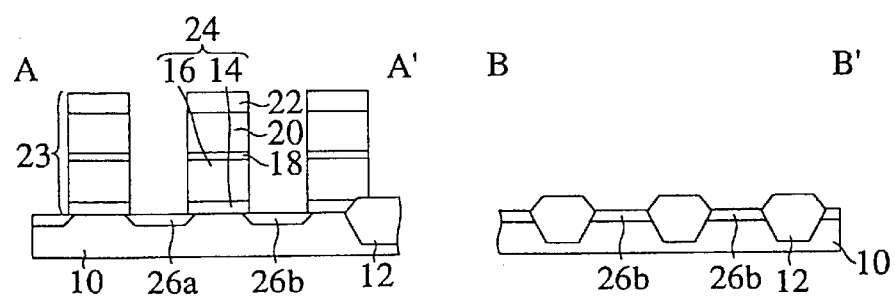

Next, the polysilicon film 14, the tungsten silicide film 16, the silicon oxide film 18, the silicon nitride film 20 and the silicon nitride oxide film 22 are sequentially formed by CVD to form the laminated film 23 (see FIG. 4B).

Then, the laminated film 23 is patterned as required to form the gate electrode 24 of a polycide structure of the polysilicon film 14 and the tungsten silicide film 16. Next, with the laminated film 23 as a mask, dopant ions are implanted in the silicon substrate 10 to form the source/drain diffusion layer 26a, 26b by self-alignment with the laminated film 23 (see FIG. 4C).

Then, a silicon nitride film is formed on the entire surface and is anisotropically etched until the surfaces of the silicon substrate 10, the device isolation film 12 and the laminated film 23 are exposed to form the sidewall insulating film 28 on the side walls of the laminated film 23.

Then, the stopper film 30 of an about 20 nm-thickness silicon nitride film is formed on the entire surface. Then, the inter-layer insulating film 32 of an about 0.5 $\mu$m-thickness BPSG film having different etching characteristics from the stopper film 30 is formed by CVD. Next, the surface of the inter-layer insulating film 32 is planarized by reflow and CMP (see FIG. 4D).

Figure 5A:
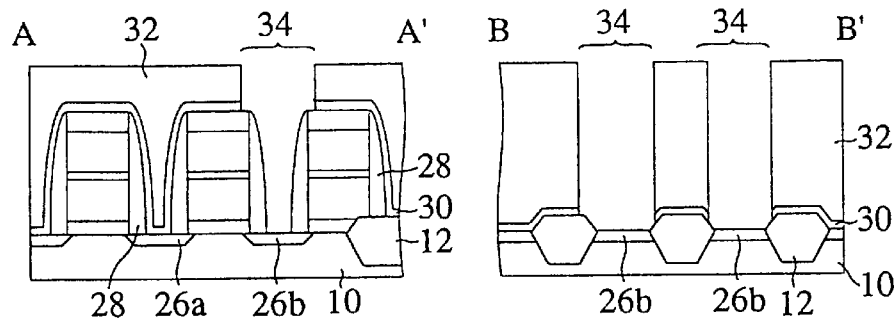
FIGS. 5A to 5C are sectional views of the semiconductor device according to the first embodiment, which show the method for fabricating the same (Part 2).

Next, the inter-layer insulating film 32 is etched at a high selection ratio with respect to the stopper film 30, and then the exposed stopper film 30 is etched to form the contact hole 34 exposing the surface of the source/drain diffusion layer 26b (see FIG. 5A).

Next, a polysilicon film is formed on the entire surface by CVD. Then, the polysilicon film is polished by CMP until the surface of the inter-layer insulating film 32 is exposed to form the conductor plug 36a of the polysilicon film buried in the contact hole 34 (see FIG. 5B, FIG. 2).

Figure 5B:
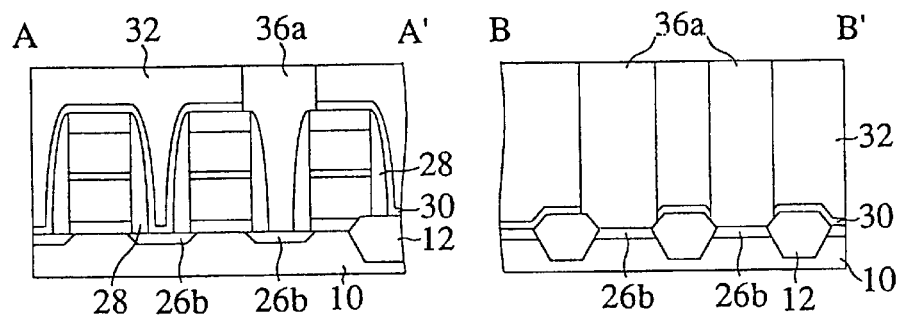
Figure 5C:
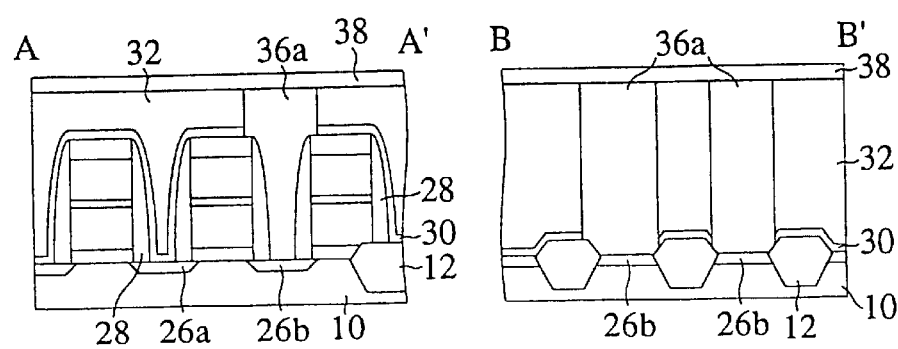

Then, the silicon oxide film 38 is formed in an about 0.1 $\mu$m thickness on the entire surface by CVD (see FIG. 5C).

Figure 6A:
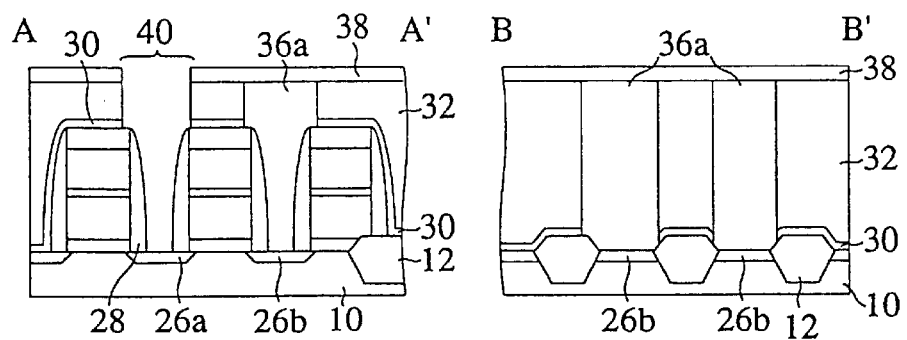
FIGS. 6A to 6C are sectional views of the semiconductor device according to the first embodiment, which show the method for fabricating the same (Part 3).
Figure 6B:
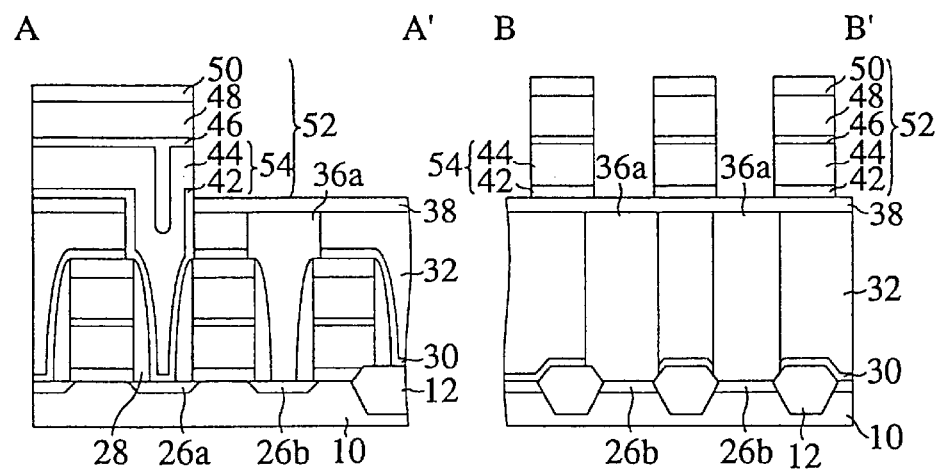
Figure 6C:
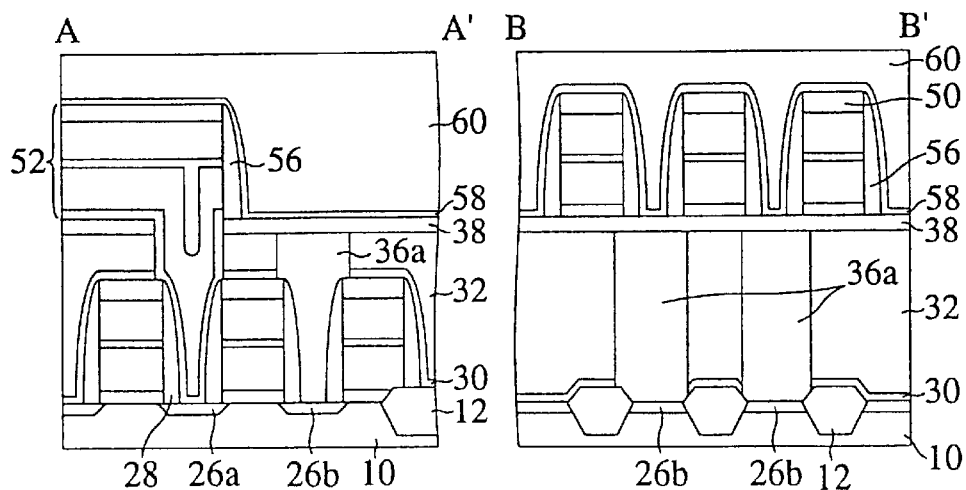
Figure 7A:
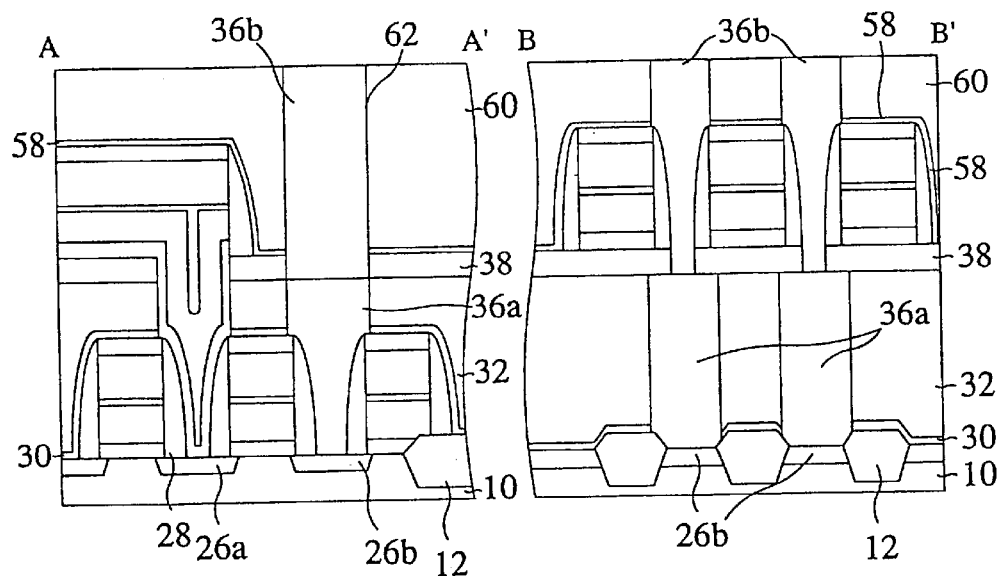
FIGS. 7A and 7B are sectional views of the semiconductor device according to the first embodiment, which show the method for fabricating the same (Part 4).
Figure 7B:
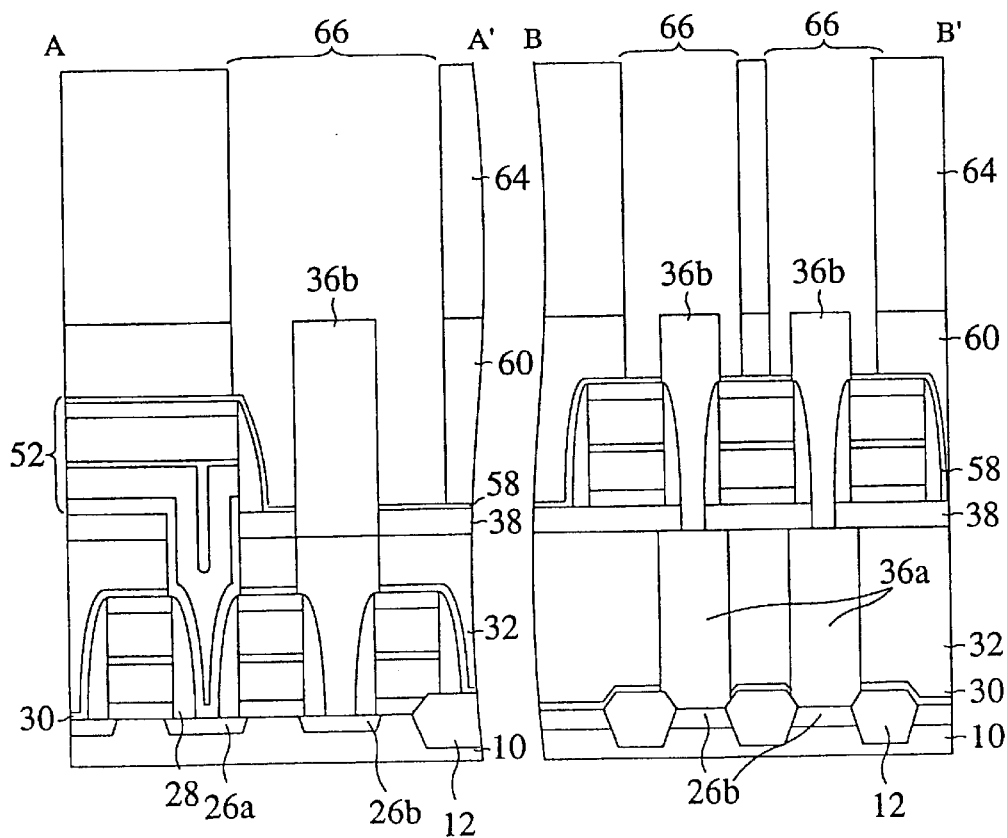
Figure 8A:
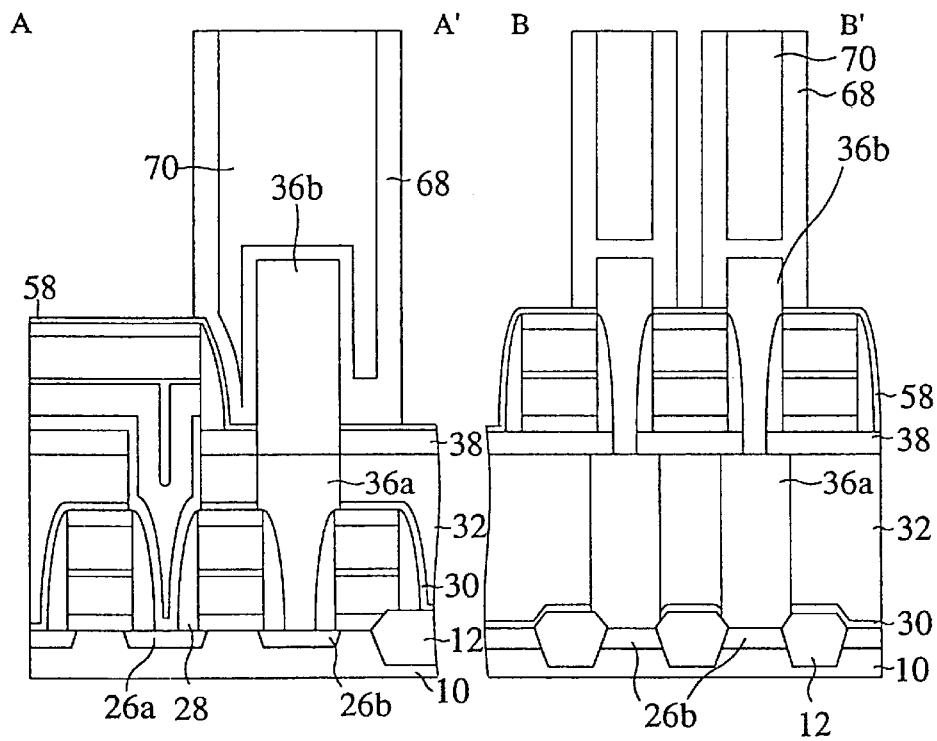
FIGS. 8A and 8B are sectional views of the semiconductor device according to the first embodiment, which show the method for fabricating the same (Part 5).
Figure 8B:
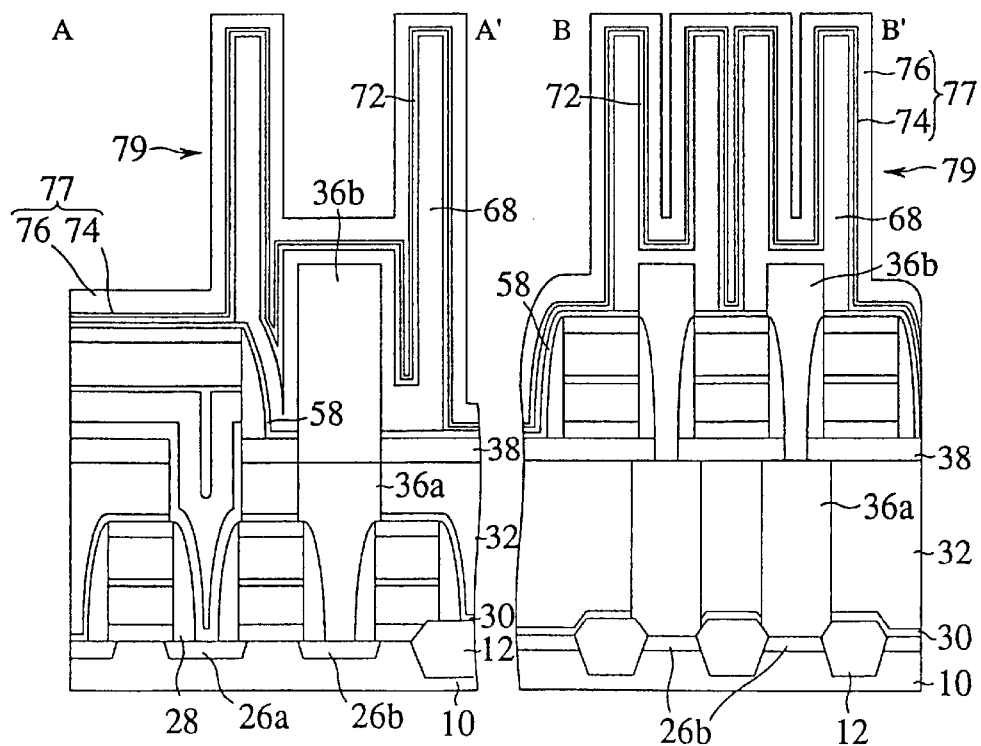

Next, the silicon oxide film 38 and the inter-layer insulating film 32 are etched at a high selection ratio with respect to the stopper film 30, and then the exposed stopper film 30 is etched to form the contact hole 40 exposing the surface of the source/drain diffusion layer 26a (see FIG. 6A).

Next, the polysilicon film 42, the tungsten silicide film 44, the silicon oxide film 46, the silicon nitride film 48 and the silicon nitride oxide film 50 are sequentially formed on the entire surface by CVD to form the laminated film 52 of these films. Then, the laminated film 52 is pattered as required to form the bit line 54 of the polycide structure of the polysilicon film 42 and the tungsten silicide film 44 (see FIG. 6B).

Then, a silicon nitride film is formed on the entire surface and is anisotropically etched until the surfaces of the silicon oxide film 38 and the laminated film 52 are exposed to form the sidewall insulating film 56 on the side walls of the laminated film 52. The sidewall insulating film 56 is for forming the SAC for ensuring a large margin for disalignment of the micronized contact.

It is possible that subsequently the silicon oxide film 38 is etched with the sidewall insulating film 56 as a mask to expose the upper surface of the conductor plug 36a.

Then, the stopper film 58 of an about 20 nm-thickness silicon nitride film is formed on the entire surface by CVD.

Subsequently, the inter-layer insulating film 60 of an about 0.5 $\mu$m-thickness BPSG film and having etching characteristics different from the stopper film 58 is formed on the entire surface by CVD. Then, the surface of the inter-layer insulating film 60 is planarized by CMP (see FIG. 6C).

Next, the inter-layer insulating film 60 is etched at a high selection ratio with respect to the stopper film 58. Then the exposed stopper film 58 is etched, and further the exposed silicon oxide film 38 is etched to form the contact hole 62 exposing the upper surface of the conductor plug 36a.

Next, a polysilicon film is formed on the entire surface by CVD. Then, the polysilicon film is polished by CMP until the surface of the inter-layer insulating film 60 is exposed to form the conductor plug 36b of the polysilicon film buried in the contact hole 62 (see FIG. 7A).

Then, the BPSG film of an about 1.7 $\mu$m-thickness is formed on the entire surface by CVD. Next, the BPSG film 64 and the inter-layer insulating film 60 are etched at a high selection ratio with respect to the stopper film 58 to form an opening 66 exposing the upper surface and the side surfaces of the conductor plug 36b. Because the stopper film 58, which functions as an etching stopper, is positioned near the underside of the conductor plug 36b, large parts of even the side surfaces of the conductor plug 36b are exposed. In the conventional semiconductor device, because only the upper surface of the conductor plug is exposed, the storage electrode is formed upper of the upper surface of the conductor plug, but in the present embodiment, because not only the upper surface of the conductor plug 36b but also the side surfaces thereof are exposed, the storage electrode 68 has a large surface area near the side surfaces of the conductor plug 36b, whereby the capacitor 79 of a large capacity can be formed (see FIG. 7B).

Then, an about 0.05 $\mu$m-thickness polysilicon film is formed on the entire surface by CVD. Subsequently resist is applied to the entire surface to form a resist film 70. The polysilicon film and the resist film 70 are polished by CMP until the surface of the BPSG film is exposed. Thus the storage electrode 68 of the polysilicon film is formed inside the opening 66. In forming the polysilicon film, because even the side surfaces of the conductor plug 36b are exposed inside the opening 66, the storage electrode 68 is formed not only on the upper surface of the conductor plug 36b but also on the side surfaces thereof. The storage electrode 68 formed not only on the upper surface of the conductor plug 36b but also on the side surfaces thereof can be securely fixed. The storage electrode 68 formed not only on the upper surface of the conductor plug 36b but also on the side surfaces thereof has a large surface area near the conductor plug 36b, whereby the storage electrode 68 can be reduced in height and resultantly the capacitor 79 can be reduced in height.

Subsequently, with the stopper film 58 as an etching stopper the BPSG film 64 is removed by HF-based wet etching. The storage electrode 68 is securely fixed to the conductor plug 36b, whereby the storage electrode 68 is prevented from release from the conductor plug 36b by the wet etching, and furthermore the etchant is prohibited from intruding into the region-not-to-be-etched (see FIG. 6A).

Then, the residual resist film 70 inside the storage electrode 68 is removed by ashing.

Next, for characteristic improvement of the capacitor 79, the surface of the storage electrode 68 of polysilicon film is nitrided by about 2 nm by RTN (Rapid Thermal Nitridation). Then, the tantalum oxide film 72 is formed in an about 8 nm-thickness on the entire surface by CVD. The tantalum oxide film 72 functions as a dielectric of the capacitor 79.

Then, thermal oxidation, $O_2$ plasma anneal or others is performed at 800° C. for characteristic improvement of the capacitor 79. Then, the titanium nitride film 74 is formed in a 0.05 $\mu$m thickness by CVD, and subsequently the polysilicon film 76 is formed in a 0.1 $\mu$m thickness, whereby the opposed electrode 77 of the titanium nitride film 74 and the polysilicon film 76 is formed (see FIG. 8B and FIG. 3). Thus, the semiconductor device can be micronized so as to have an about 0.2 $\mu$m-minimum line width.

In the step of forming the opening 66, it is a problem that the surface of the photoresist is etched and the thickness of the photoresist become thin, because the opening 66 has a high aspect ratio. However, the BPSG film 64 and the inter-layer insulating film 60 are etched at a high selection ratio with respect to the photoresist, whereby the photoresist can be prevented from being thinned.

Figure 9:
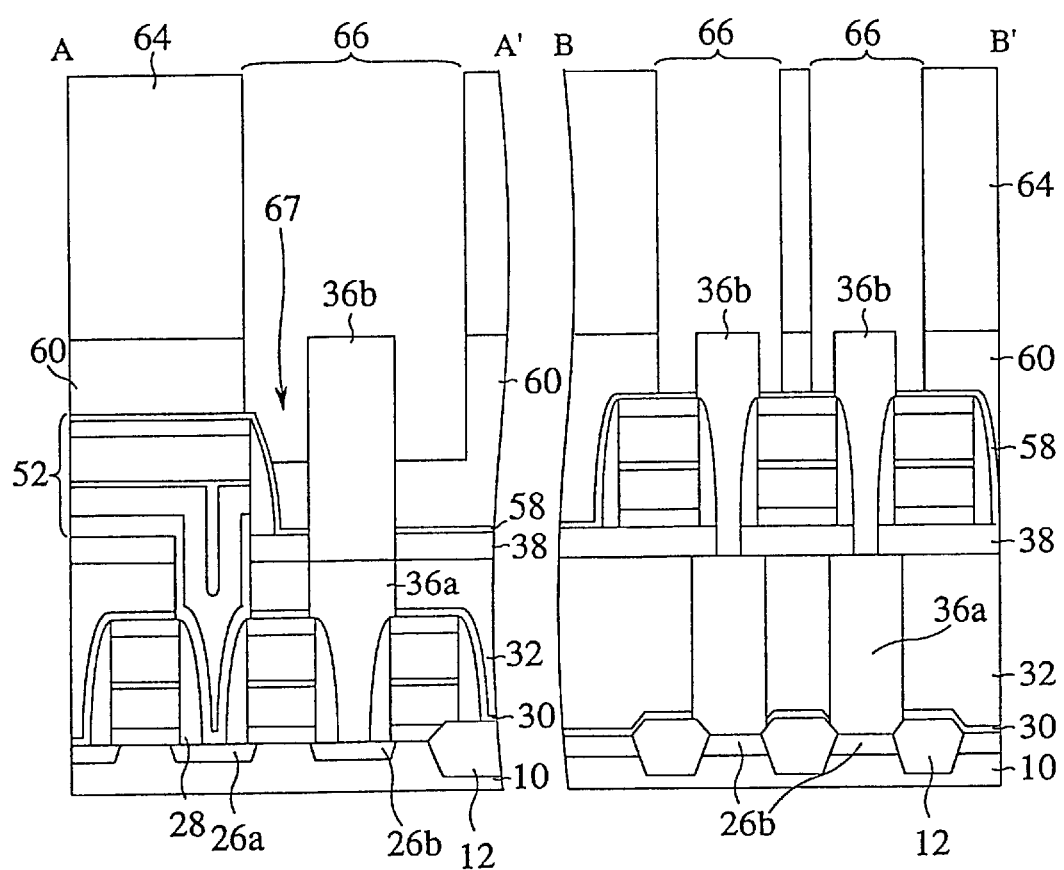
FIG. 9 is sectional views of another example of the semiconductor device according to the first embodiment, which show the method for fabricating the same (Part 1).

In etching the BPSG film 64 and the inter-layer insulating film 60 at a high selection ratio with respect to the photoresist, because the region between the stopper film 58 and the conductor plug 36b has a smaller etching area as shown in FIG. 9, etching stop often takes place. When the etching stop occurs, the inter-layer insulating film 60 is not all etched to reside on the stopper film 58. However, because of the sufficient exposed area of the side surfaces of the conductor plug 36b it is not necessary that the etching is performed until the stopper film 58 is completely exposed inside the opening 66.

Figure 10:
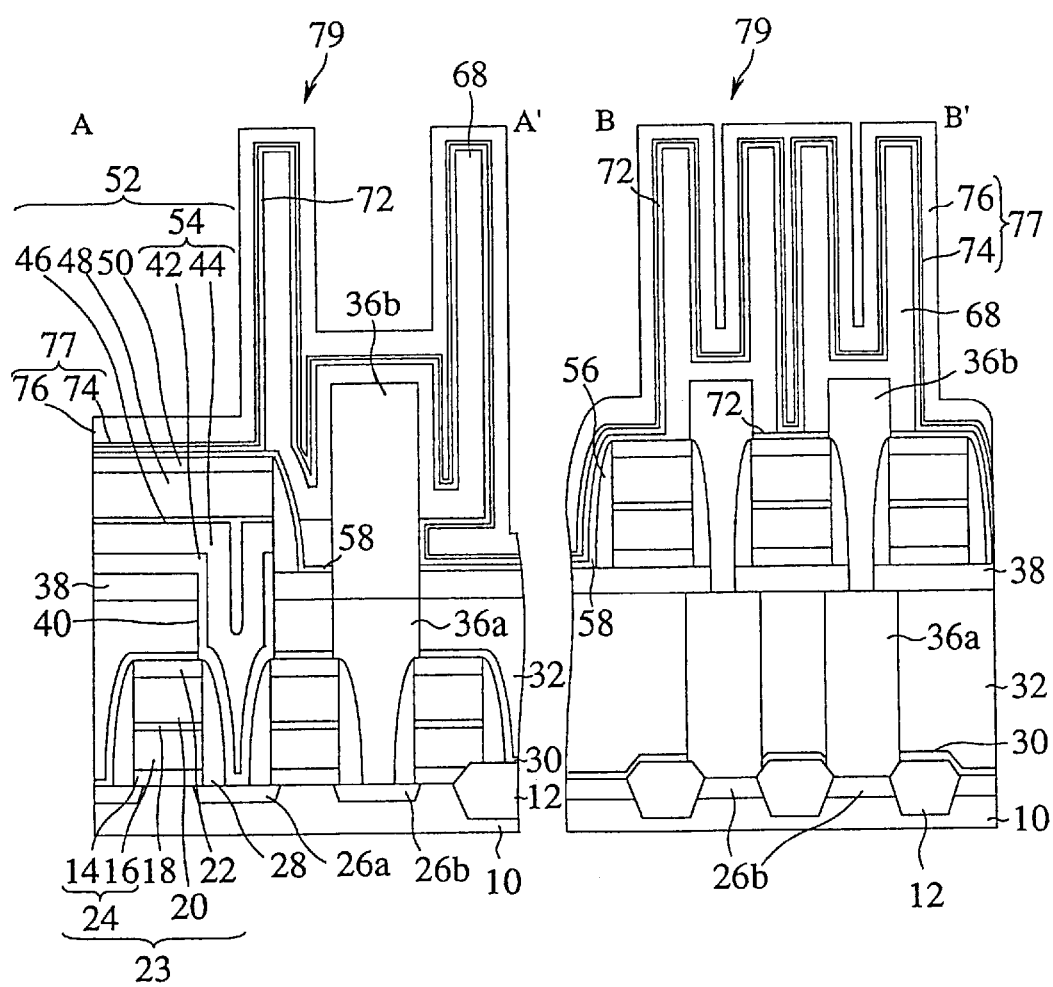
FIG. 10 is sectional views of another example of the semiconductor device according to the first embodiment, which show the method for fabricating the same (Part 2).

When the etching stop shown in FIG. 9 takes place, the semiconductor device shown in FIG. 10 is fabricated.

As described above, according to the present embodiment, the storage electrode is formed not only on the upper surface of the conductor plug but also on the side surfaces thereof, whereby the storage electrode is securely fixed to the conductor plug. Accordingly the storage electrode is prevented from being released from the conductor plug by the wet etching. Furthermore, because the storage electrode is securely fixed to the conductor plug, the etchant is prohibited from intruding the region-not-to-be-etched. Accordingly the semiconductor device can be fabricated at higher yields. Because the storage electrode is formed not only on the upper surface but also on the side surfaces thereof, the capacitor can have a larger electrode area near the conductor plug. Accordingly the capacitor can be reduced in height.

[A Second Embodiment]

Figure 11:
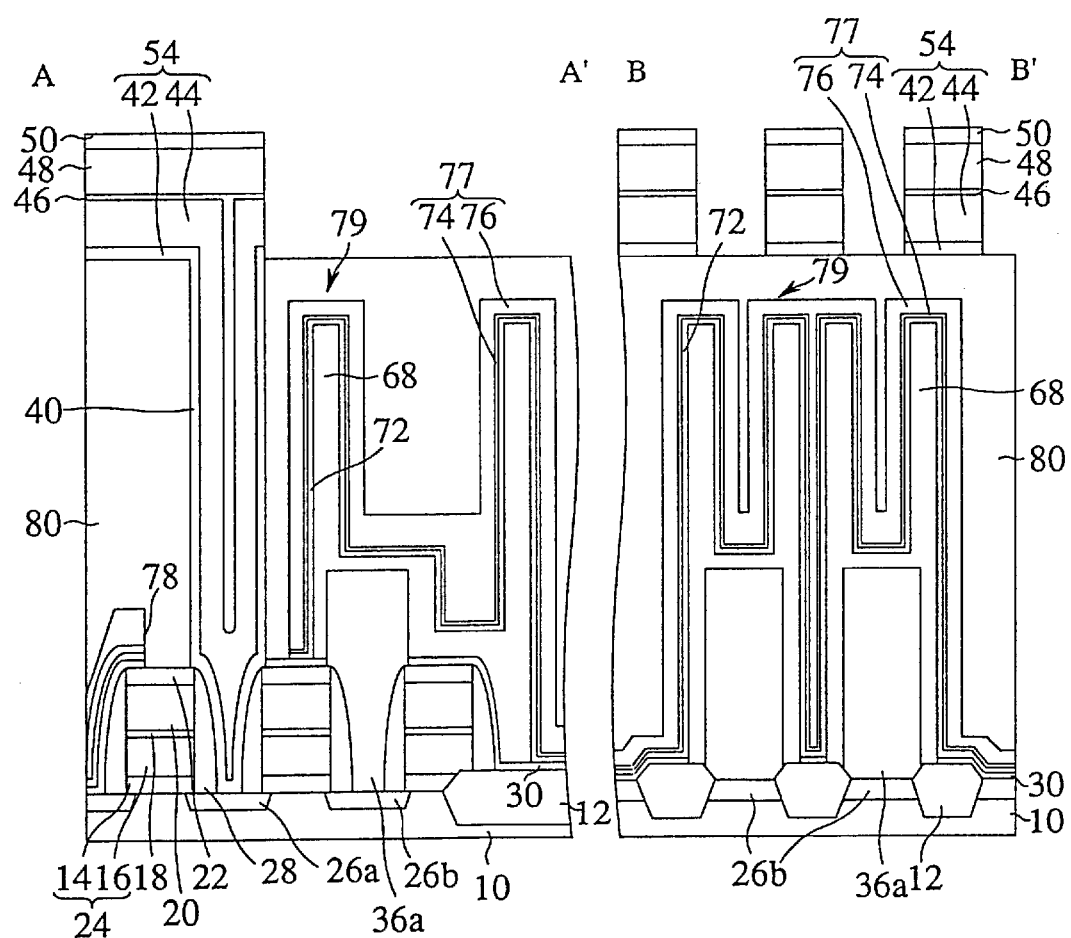
FIG. 11 is a sectional view of the semiconductor device according to a second embodiment of the present invention, which shows a structure thereof.

The semiconductor device according to a second embodiment of the present invention and the method for fabricating the semiconductor device will be explained with reference to FIGS. 11 to 14. FIG. 11 is a sectional view of the semiconductor device according to the present embodiment, which shows a structure thereof. FIGS. 12A to 14 are sectional views of the semiconductor device according to the present embodiment in the steps of the method for fabricating the semiconductor device, which shows the fabrication method. The same members of the semiconductor device according to the present embodiment as those of the semiconductor device according to the first embodiment and the method for fabricating the same are represented by the same reference numbers not to repeat or to simplify their explanation.

[The Semiconductor Device]

First, the semiconductor device according to the present embodiment will be explained with reference to FIG. 11.

The semiconductor according to the present embodiment includes a storage electrode 68 directly connected to a conductor plug 36a without the conductor plug 36b formed in the first embodiment, a capacitor 79 covered with an inter-layer insulating film 80, and a bit line 54 formed on the inter-layer insulating film 80.

The bit line 54 formed on the inter-layer insulating film 80 is connected to the source/drain diffusion layer 26a of a transfer transistor through a contact hole 40 and an opening 78 formed in the inter-layer insulating film 80.

The semiconductor device according to the present embodiment including the bit line formed above the capacitor as described above can produce the same advantageous effects as the first embodiment.

[Method for Fabricating the Semiconductor Device]

Next, the method for fabricating the semiconductor device will be explained with reference to FIGS. 12A to 14.

The method for fabricating the semiconductor device according to the present embodiment is the same as the method for fabricating the semiconductor device according to the first embodiment up to the step of forming the conductor plug 36a shown in FIG. 5B, and the fabrication steps up to the conductor plug forming step are not explained.

After the conductor plug 36a is formed, an about 1.0 $\mu$m-thickness BPSG film 64 is formed on the entire surface by CVD.

Then, the BPSG film 64 and the inter-layer insulating film 32 are etched at a high selection ratio with respect to the stopper film 30 to form an opening 66 exposing the upper surface and the side surfaces of the conductor plug 36a. Because the stopper film 30, which functions as an etching stopper, is positioned near the underside of the conductor plug 36a, the etching exposes large parts of the side surfaces of the conductor plug 36a (see FIG. 12A).

Next, in the same way as in the first embodiment a polysilicon film is formed on the entire surface, and a resist film 70 is formed on the entire surface, and then the polysilicon film and the resist film 70 are polished to form the storage electrode 68. Because even the side surfaces of the conductor plug 36a are sufficiently exposed inside the opening 66 in forming the polysilicon film, the storage electrode 68 is formed not only on the upper surface of the conductor plug 36a but also on the side surfaces thereof. Accordingly the storage electrode 68 is formed also on the side surfaces of the conductor plug 36a, whereby the storage electrode 68 is securely fixed to the conductor plug 36a. Because the storage electrode 68 is formed not only on the upper surface of the conductor plug 36a but also on the side surfaces thereof the storage electrode 68 has a large surface area near the conductor plug 36a, whereby the storage electrode 68 can be reduced in height, and also the capacitor 79 can be reduced in height.

Figure 12A:
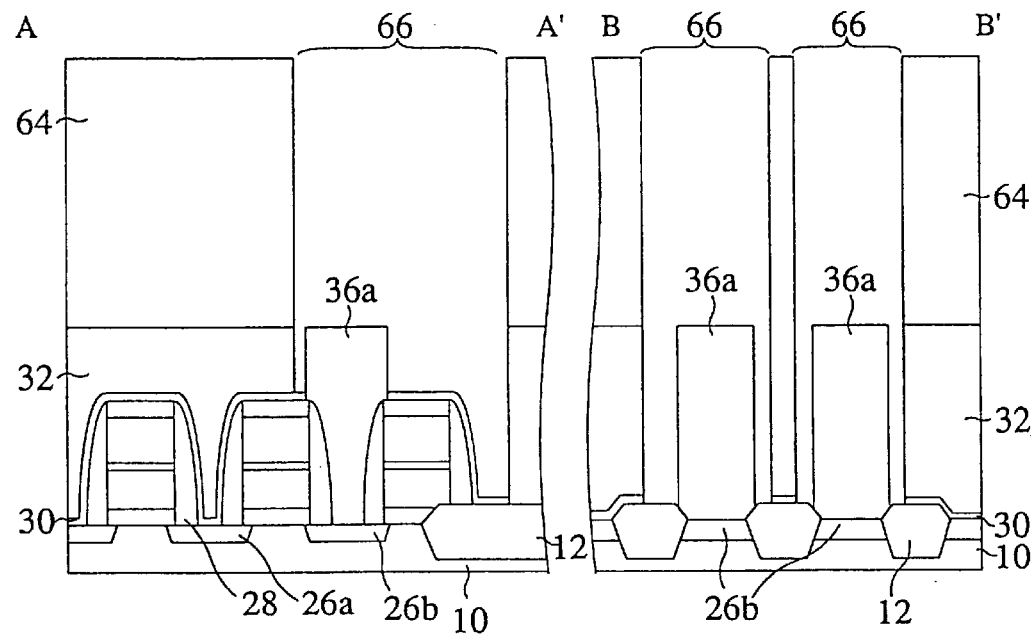
FIGS. 12A and 12B are sectional views of the semiconductor device according to a second embodiment, which show the method for fabricating the same (Part 1).
Figure 12B:
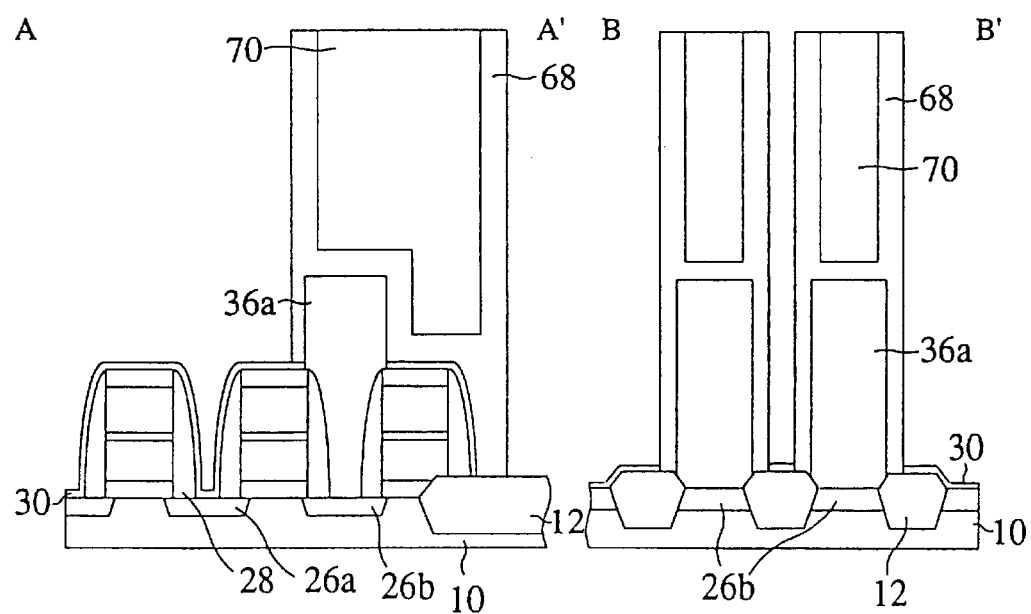

Then, in the same way as in the first embodiment the inter-layer insulating film 32 and the BPSG film 64 can be removed (see FIG. 12B).

Next, in the same way as in the first embodiment the resist film 70 left inside the storage electrode 68 is removed. Then, the surface of the storage electrode 68 is nitrided, and next a tantalum oxide film 72 is formed. Then, thermal oxidation, $O_2$ plasma annealing or others follows. Next, an opposed electrode 77 of a titanium nitride film 74 and a polysilicon film 76 is formed.

To form the contact hole 40 in a later step it is necessary that the tantalum oxide film 72, the titanium nitride film 74 and the polysilicon film 76 near the region for the contact hole 40 to be formed in is next removed in advance. To this end, with the stopper film 30 as a stopper the tantalum oxide film 72, the titanium nitride film 74 and the polysilicon film 76 are etched to form the opening 78 (see FIG. 13A).

Then, the inter-layer insulating film 80 of an about 2.0 $\mu$m-thickness BPSG film is formed by CVD. Next, the surface of the inter-layer insulating film 80 is planarized by reflow and CMP.

Figure 13A:
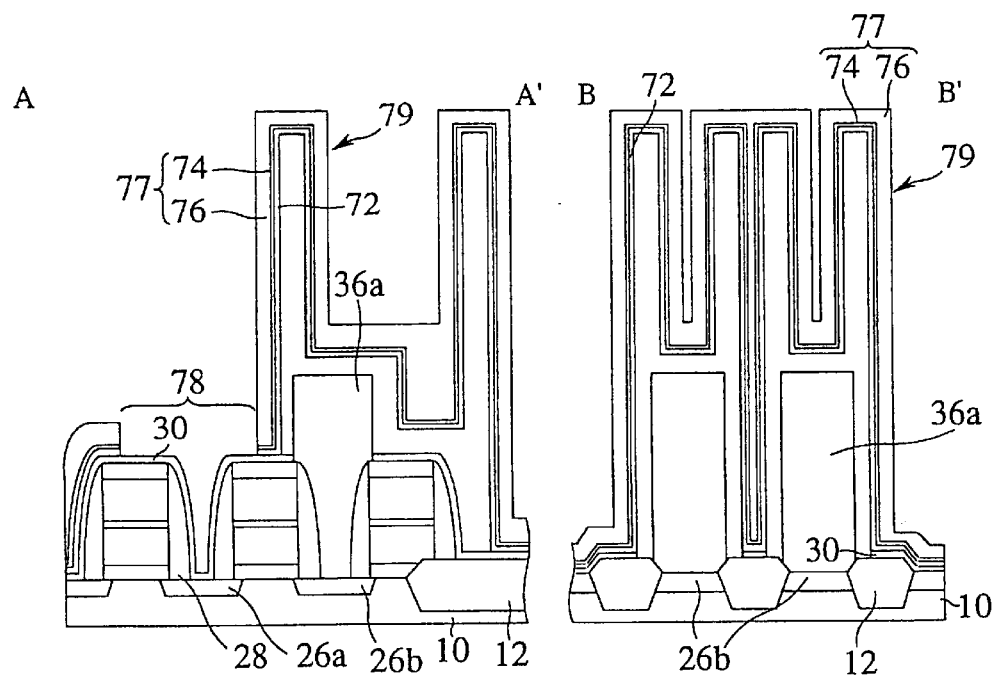
FIGS. 13A and 13B are sectional views of the semiconductor device according to the second embodiment, which show the method for fabricating the same (Part 2).
Figure 13B:
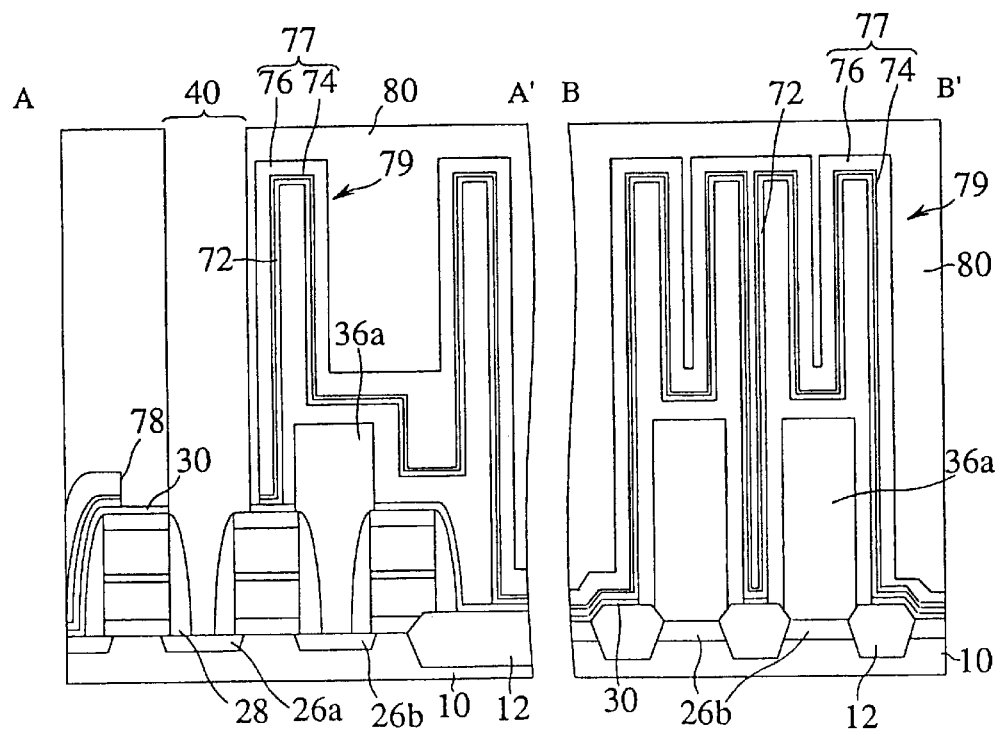
Figure 14:
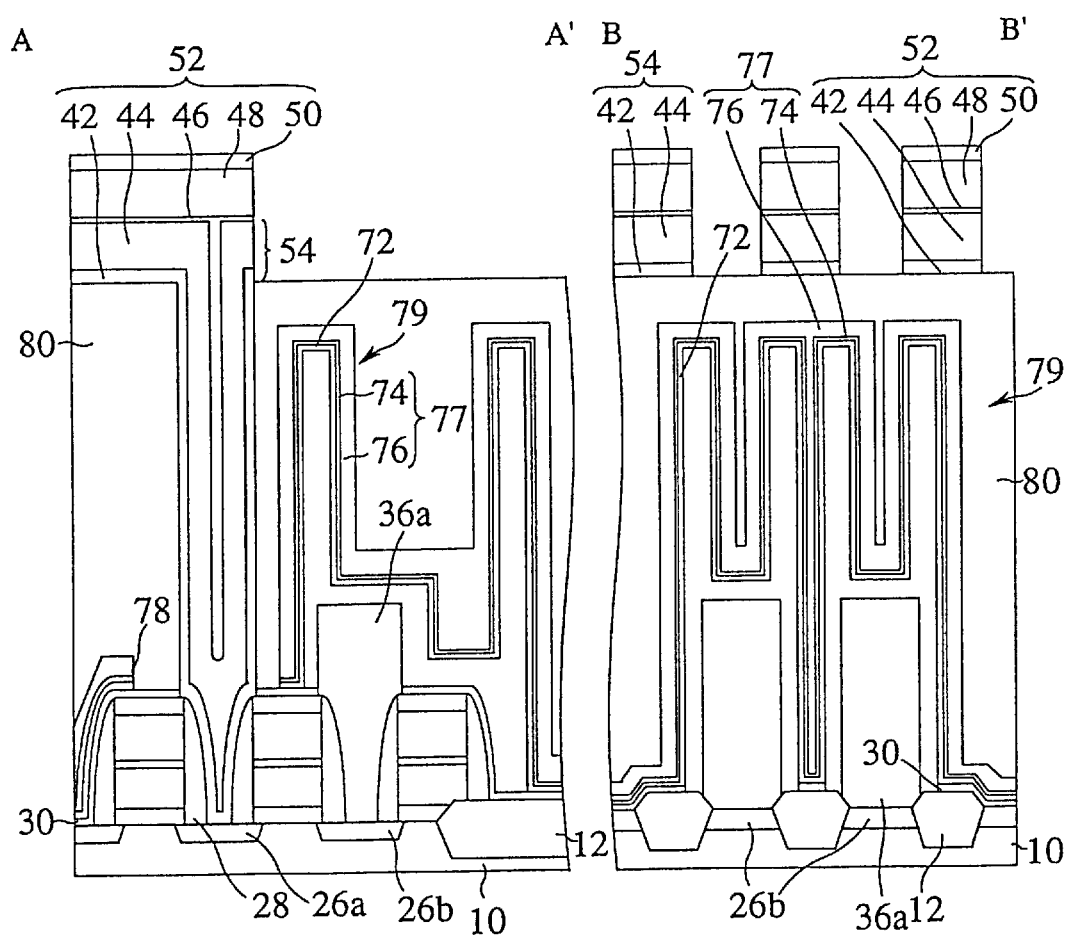
FIG. 14 is sectional views of the semiconductor device according to the second embodiment, which show the method for fabricating the same (Part 3).

Then, the inter-layer insulating film 80 is etched at a high selection ratio with respect to the stopper film 30, and then the exposed stopper film 30 is etched to form the contact hole 40 which reaches the source/drain diffusion layer 26a (see FIG. 13B).

Next, in the same way as in the first embodiment, a polysilicon film 42, a tangsten silicide film 44, a silicon oxide film 46, a silicon nitride film 48 and a silicon nitride oxide film 50 are sequentially formed on the entire surface to form the laminated film 52. Then, the laminated film 52 is patterned as required to form a bit line 54 of the polysilicon film 42 and the tangsten silicide film 44 (see FIG. 14).

Thus, the semiconductor device can be micronized so as to have an about 0.2 $\mu$m-minimum line width.

The present embodiment which relates to a method for fabricating the semiconductor device including bit lines above the capacitors can produce the same advantageous effects as the first embodiment.

[A Third Embodiment]

Figure 15:
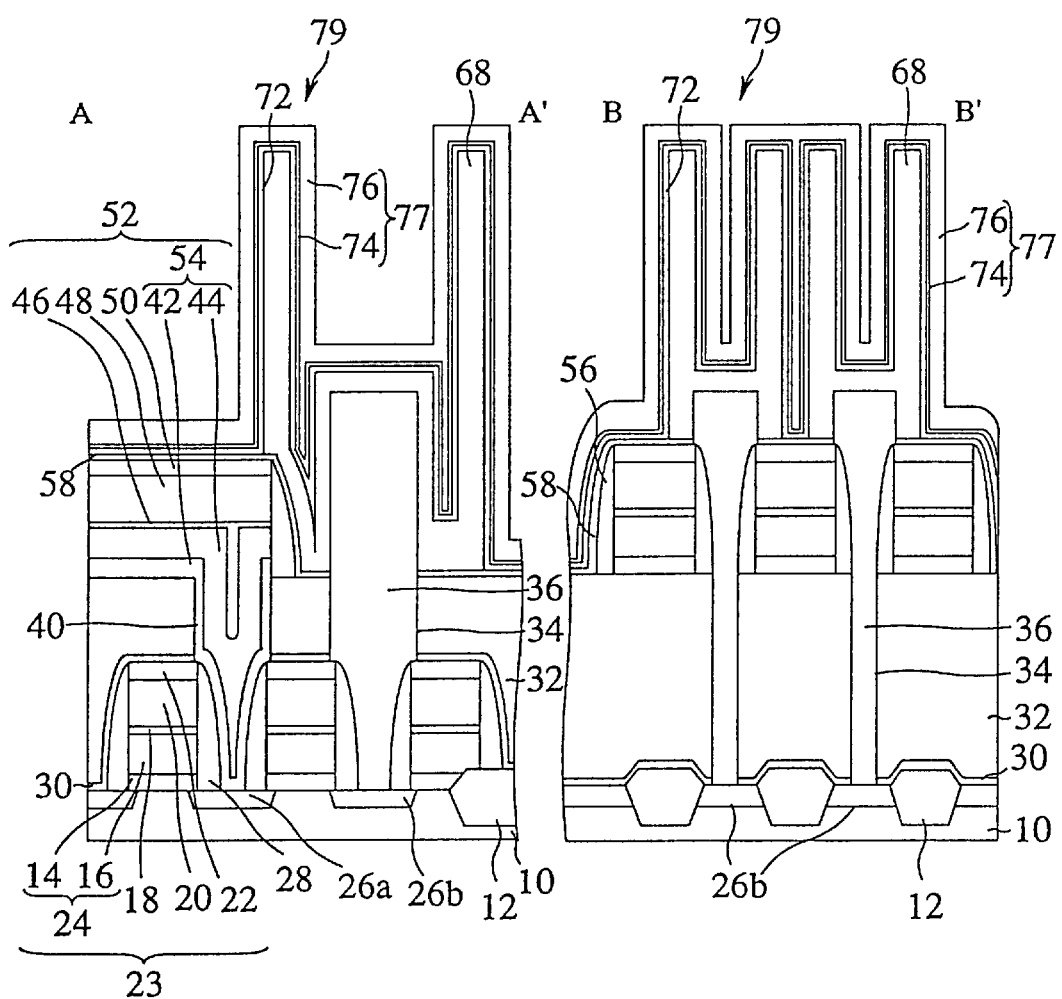
FIG. 15 is a sectional view of the semiconductor device according to a third embodiment of the present invention, which shows a structure thereof.

The semiconductor device according to a third embodiment of the present invention and a method for fabricating the semiconductor device will be explained with reference to FIGS. 15 to 17B. FIG. 15 is a sectional view of the semiconductor device according to the present embodiment, which shows a structure thereof. FIGS. 16A to 17B are sectional views of the semiconductor device in the steps of the method for fabricating the semiconductor device, which show the method. The same members of the present embodiment as those of the semiconductor device according to the first or the second embodiment and the method for fabricating the same are represented by the same reference numbers not to repeat or to simplify their explanation.

[The Semiconductor Device]

First, the semiconductor device according to the present embodiment will be explained with reference to FIG. 15.

The semiconductor device according to the present embodiment is the same as the semiconductor device according to the first embodiment in that a conductor plug 36 is formed of the same conductor film in a contact hole 34 formed down to the surface of the source/drain diffusion layer 26b formed by self-alignment with a bit line 54, and that no silicon oxide film 38 is formed.

According to the present embodiment, the conductor plug 36 is formed of the same conductor layer, which enables the semiconductor device to be fabricated by a simple process.

[The Method for Fabricating the Semiconductor Device]

Figure 4D:
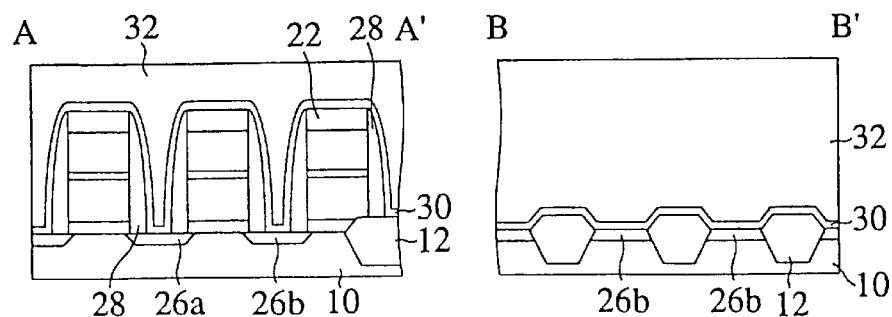

The method for fabricating the semiconductor device according to the present embodiment is the same as the first embodiment up to the step of planarizing an interlayer insulating film 32 shown in FIG. 4D, and the steps up to the inter-layer insulating film planarization step are not explained.

Figure 16A:
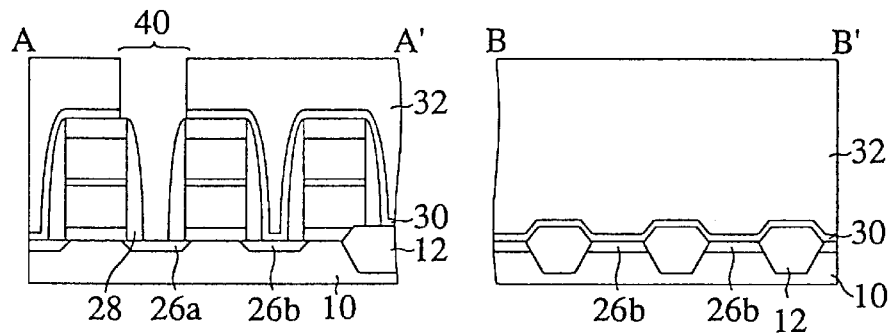
FIGS. 16A to 16C are sectional views of the semiconductor device according to the third embodiment, which show the method for fabricating the same (Part 1).

Then, in the same way as in the first embodiment a contact hole 40 which arrives at the source/drain diffusion layer 26a is formed by self-alignment with a sidewall insulating film 28 (see FIG. 16A).

Figure 16B:
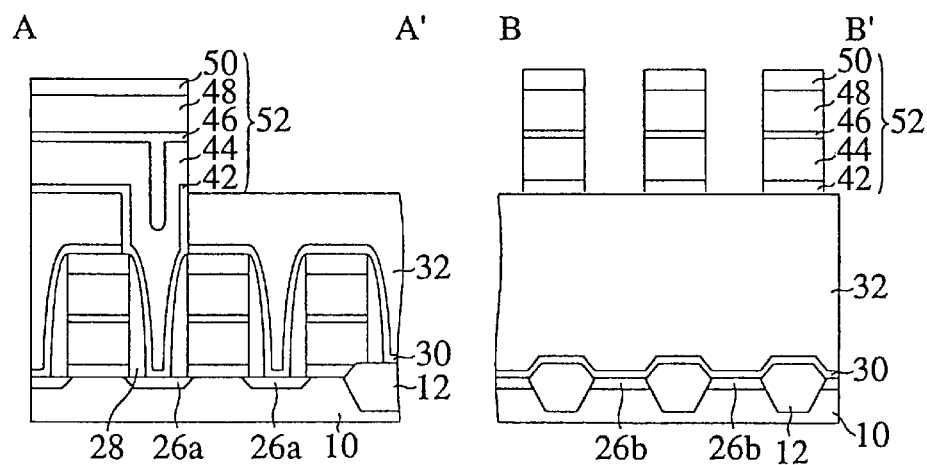

Next, in the same as in the first embodiment a laminated film 52 is formed (see FIG. 16B).

Figure 16C:
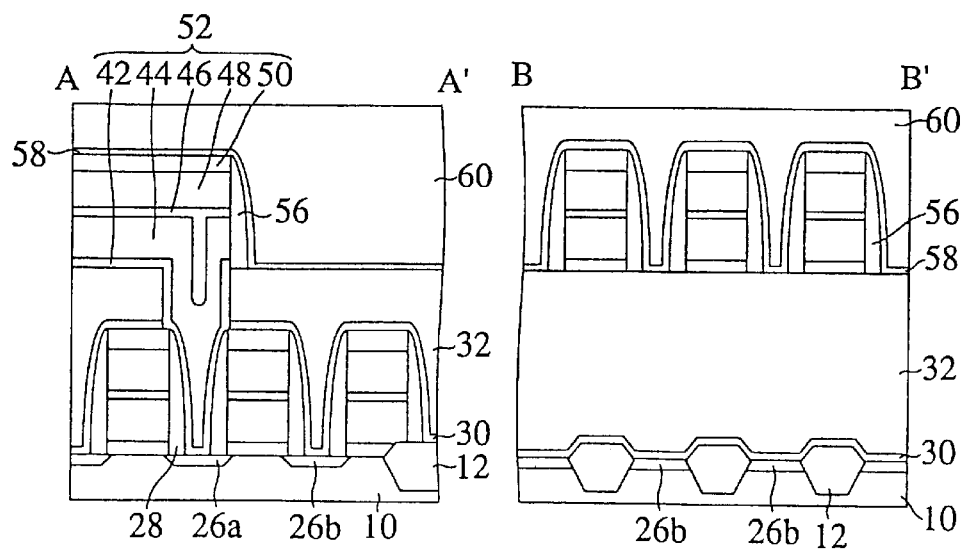

Subsequently, a sidewall insulating film 56, a stopper film 58 and an inter-layer insulating film 60 are formed, and the surface of the inter-layer insulating film 60 is planarized (FIG. 16C).

Figure 17A:
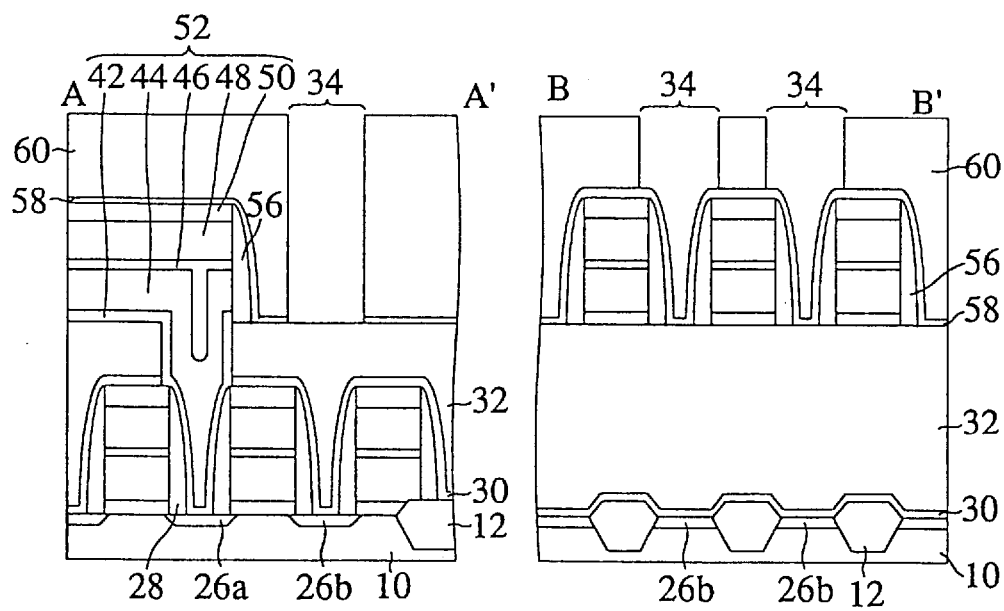
FIGS. 17A and 17B are sectional views of the semiconductor device according to the third embodiment, which show the method for fabricating the same (Part 2).
Figure 17B:
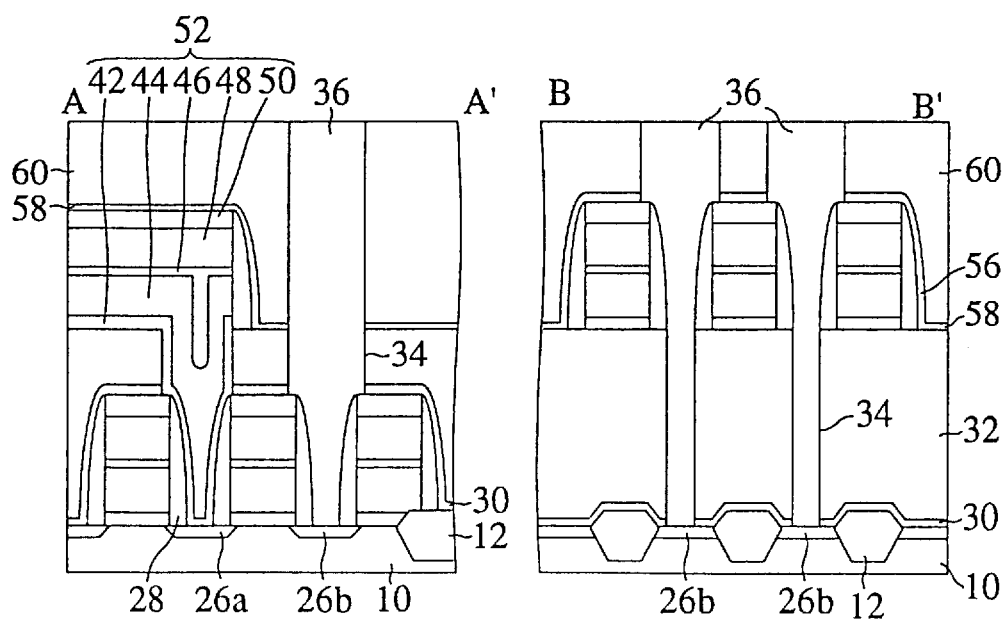

Then, to form a contact hole 34 exposing the surface of the source/drain diffusion layer 26b the inter-layer insulating film 60 is etched at a high selection ratio with respect to the stopper film 58, and then the exposed stopper film 58 is etched (see FIG. 17A).

Next, the inter-layer insulating film 32 is etched at a high selection ratio with respect to the stopper film 30, and the exposed stopper film 30 is etched to form the contact hole 34 which reaches the source/drain diffusion layer 26b.

Next, a polysilicon film is formed on the entire surface by CVD. Then, the polysilicon film is polished by CMP until the surface of the inter-layer insulating film 60 is exposed to form the conductor plug 36 of the polysilicon film buried in the contact hole 34 (see FIG. 17B).

The following steps are the same as those of the method for fabricating the semiconductor device according to the first embodiment shown in FIGS. 7B to 8B.

According to the present embodiment, the contact hole 34 which is extended from the surface of the inter-layer insulating film 60 to the source/drain diffusion layer 26b is formed, whereby the conductor plug 36 can be formed in the contact hole by one step. Accordingly the fabrication process can be simple.

[Modifications]

The present invention is not limited to the above-described embodiments <and covers other various modifications.

Figure 18A:
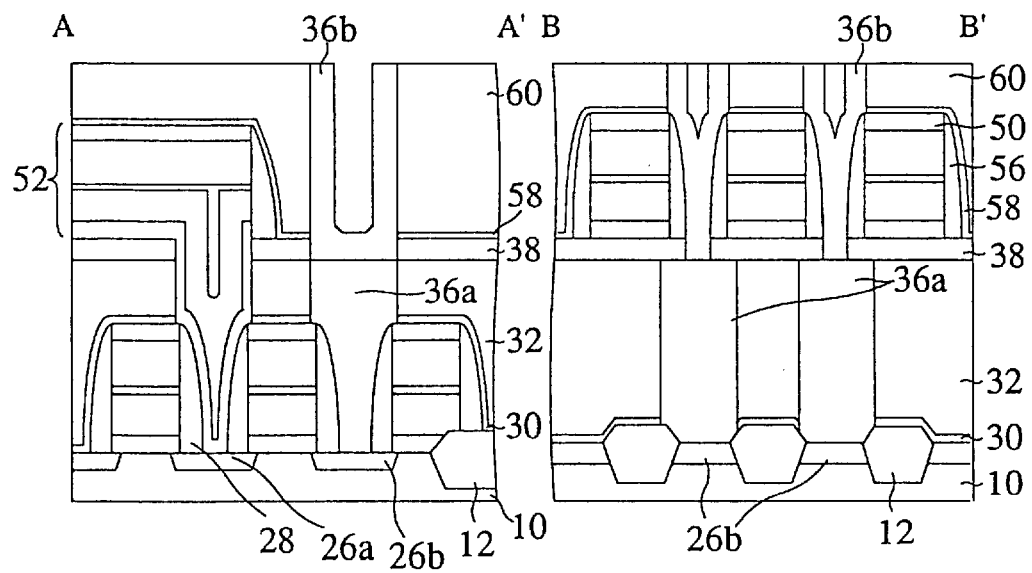
FIGS. 18A and 18B are sectional views of a modification of the semiconductor device according to the present invention, which show the method for fabricating the same.
Figure 18B:
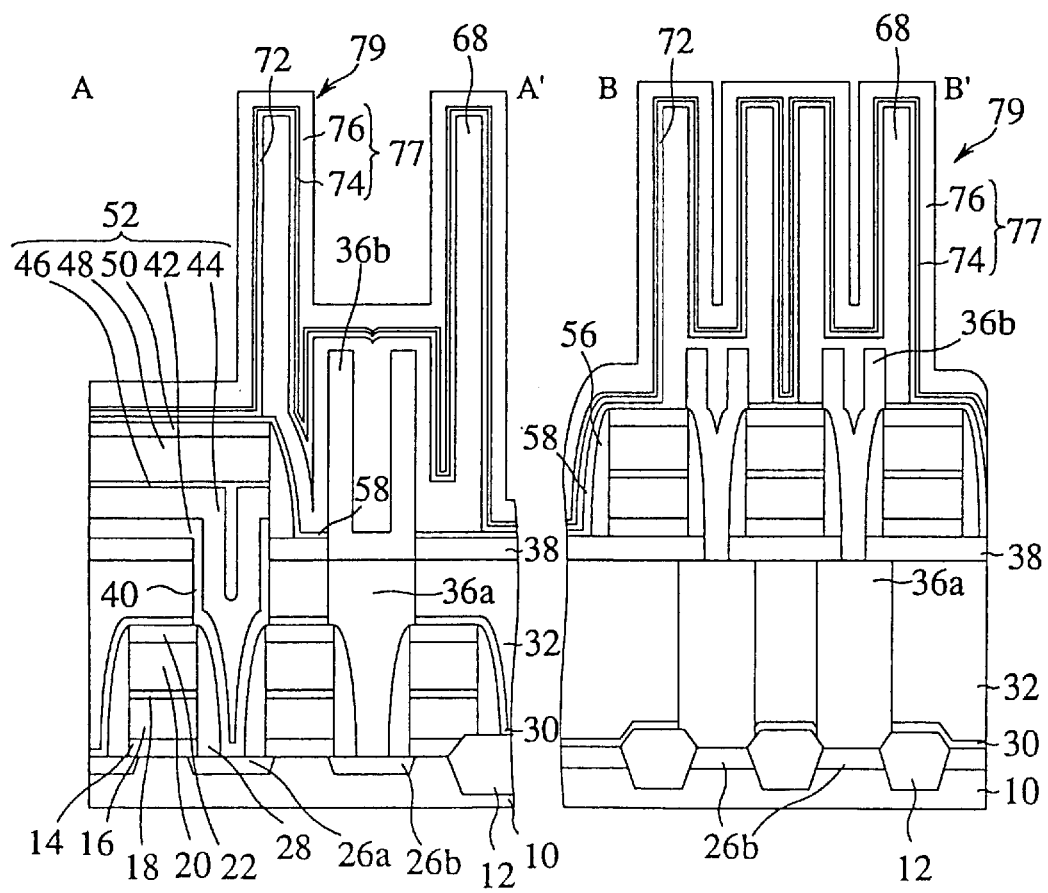
Figure 19A:
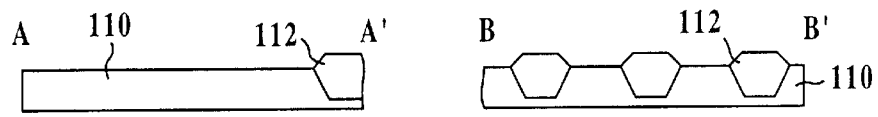
FIGS. 19A to 19D are sectional views of the conventional semiconductor device in the steps of the method for fabricating the same, which show the method (Part 1).
Figure 19B:
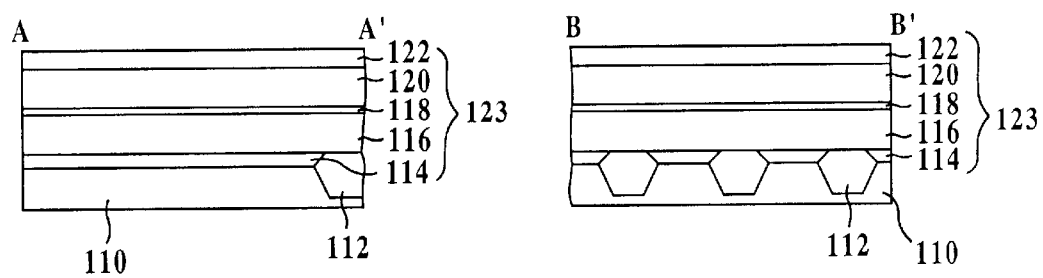
Figure 19C:
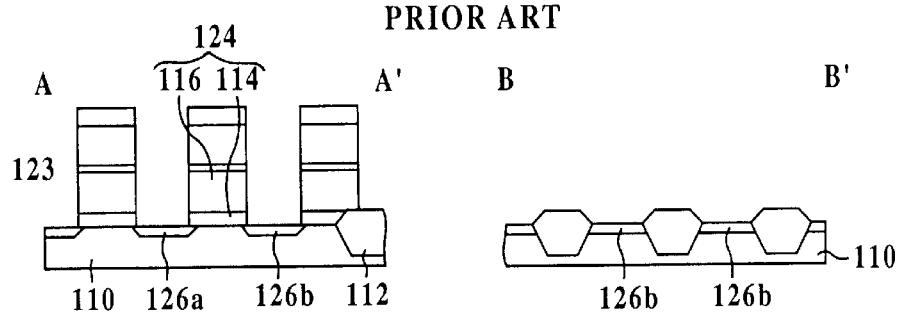
Figure 19D:
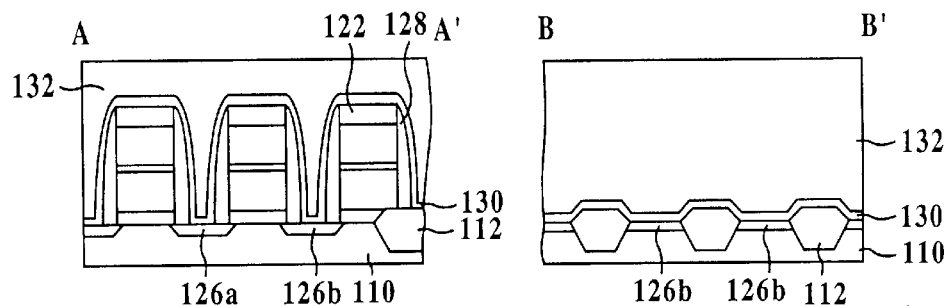
Figure 20A:
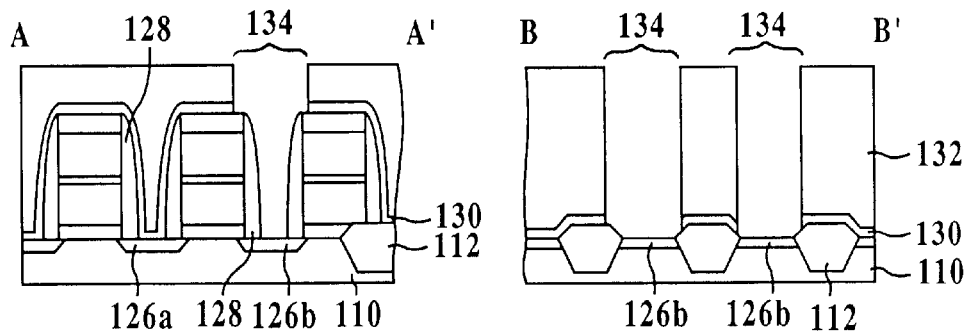
FIGS. 20A to 20C are sectional views of the conventional semiconductor device in the steps of the method for fabricating the same, which show the method (Part 2).
Figure 20B:
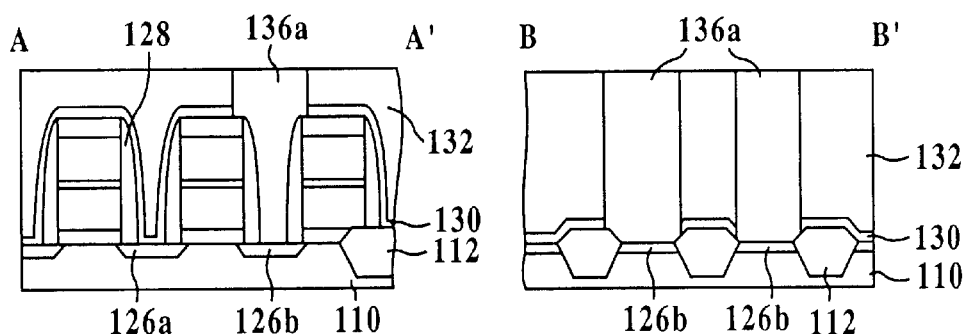
Figure 20C:
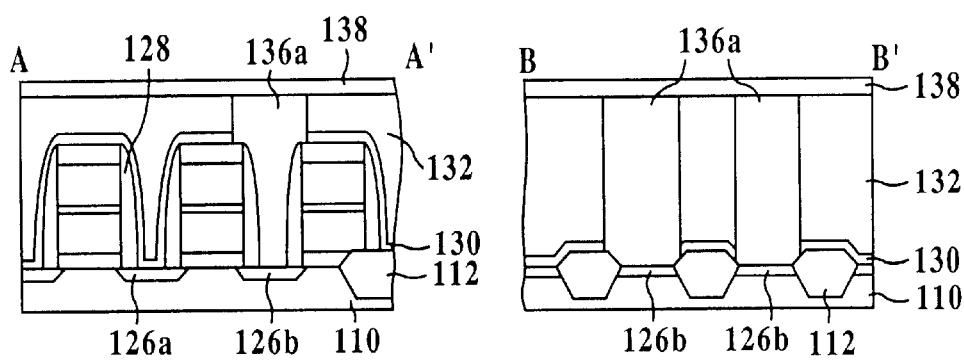
Figure 21A:
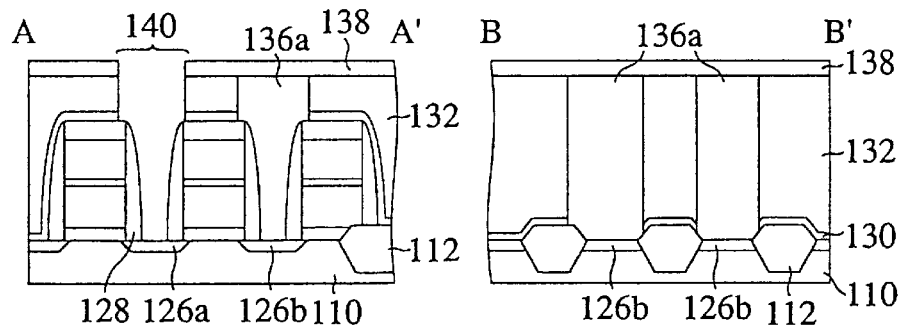
FIGS. 21A to 21C are sectional views of the conventional semiconductor device in the steps of the method for fabricating the same, which show the method (Part 3).
Figure 21B:
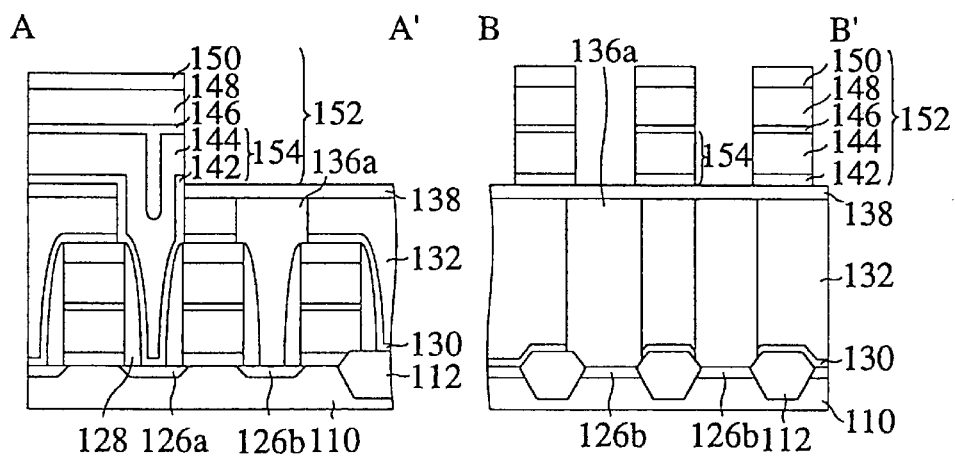
Figure 21C:
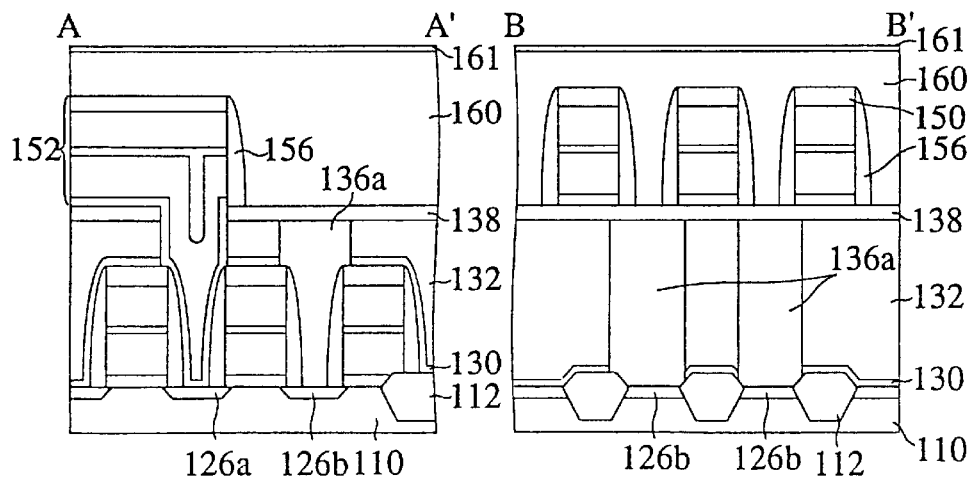
Figure 22A:
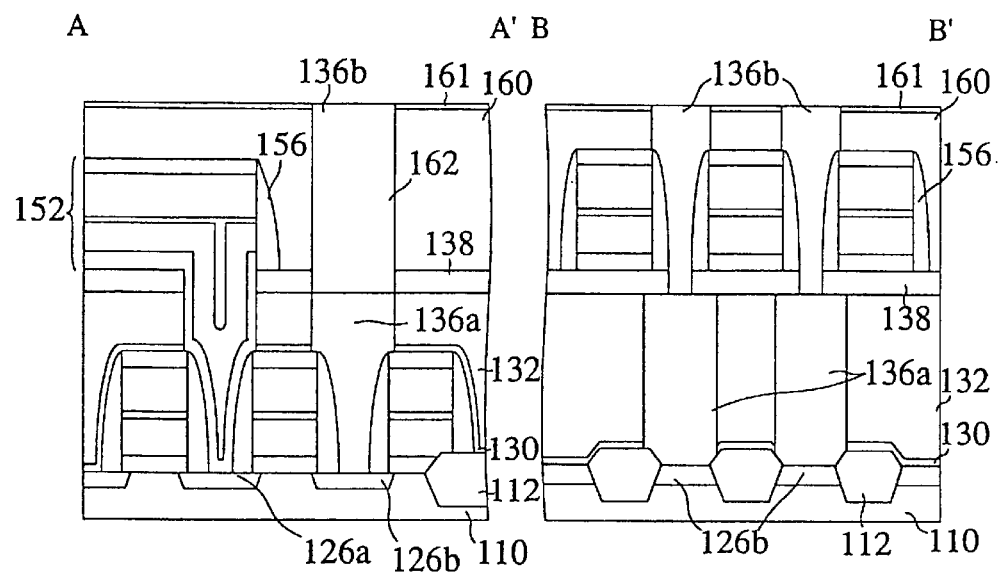
FIGS. 22A and 22B are sectional views of the conventional semiconductor device in the steps of the method for fabricating the same, which show the method (Part 4).
Figure 22B:
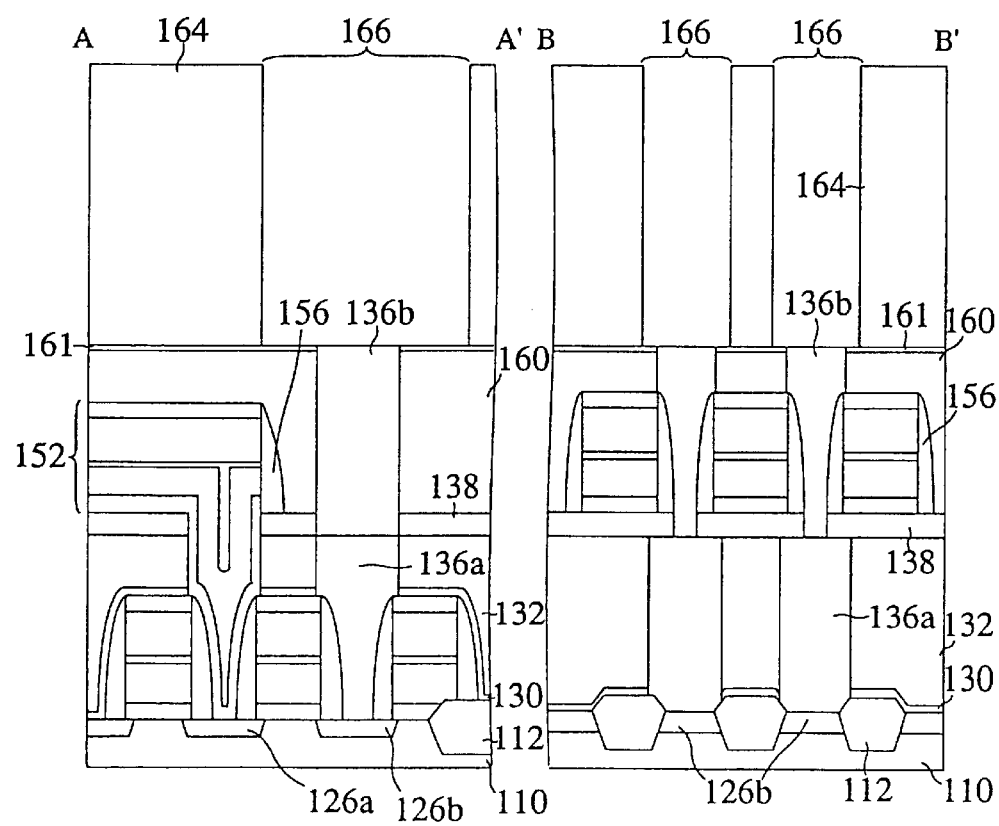
Figure 23A:
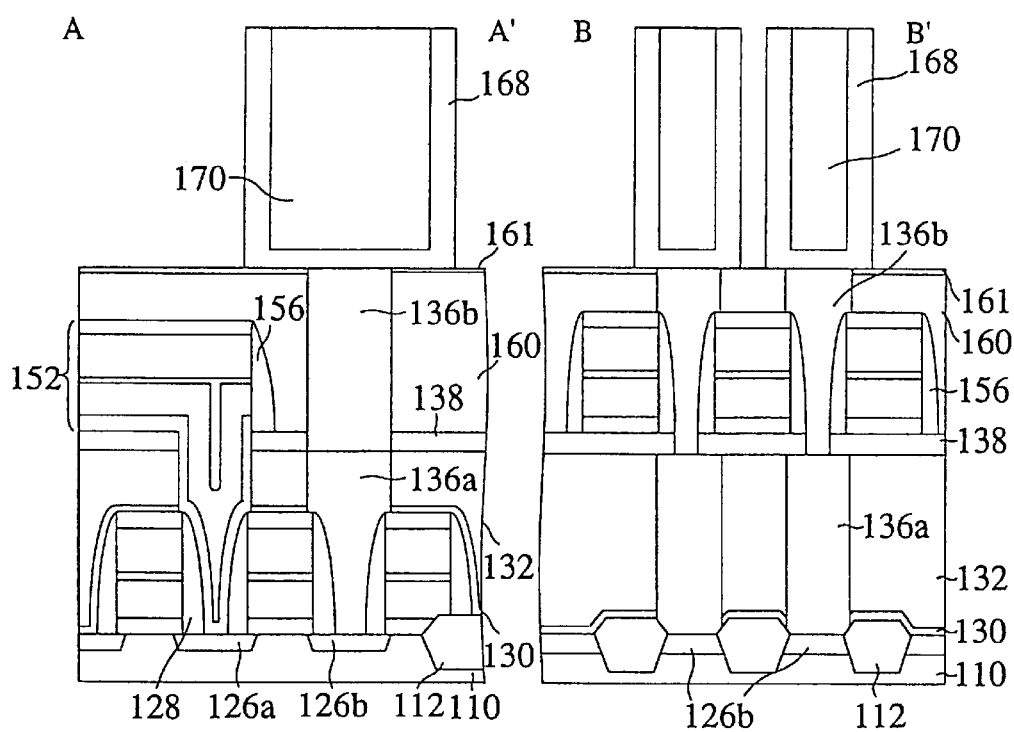
FIGS. 23A and 23B are sectional views of the conventional semiconductor device in the steps of the method for fabricating the same, which show the method (Part 5).
Figure 23B:
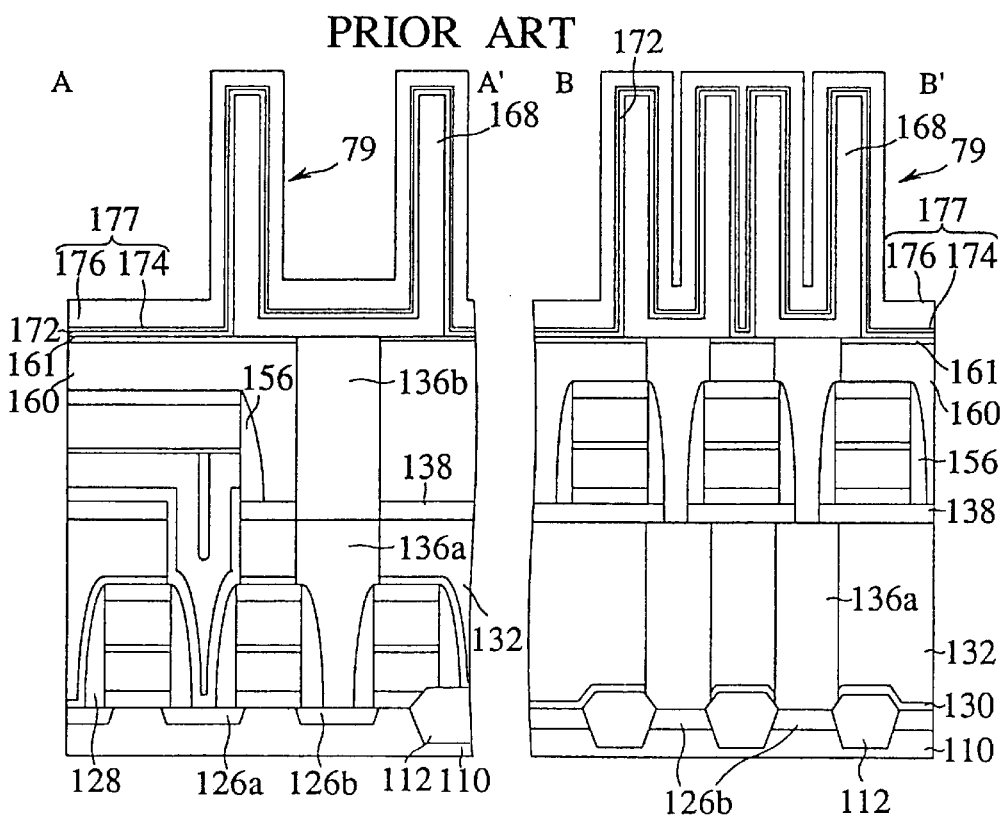

For example, in the first embodiment it is possible that in forming the conductor plug 36b the polysilicon film is formed thin to form a recess in the upper surface of the conductor plug 36b (see FIG. 18A). Accordingly the storage electrode 68 is formed even in the recess, whereby the storage electrode 68 is securely fixed to the conductor plug 36b (see FIG. 18B).

In the second embodiment it is possible that in forming the conductor plug 36a the polysilicon film formed thin to form a recess in the conductor plug 36a. Accordingly the storage electrode 68 to be formed in a later step is formed even in the recess, whereby the storage electrode 68 is securely fixed to the conductor plug 36a.

The first and the second embodiments have been explained by means of cylindrical capacitors, but the semiconductor device fabrication method according to the present invention is applicable to fabrication any semiconductor device as long as the semiconductor device is fabricated by a method in which the storage electrode is connected to the conductor plug, and the insulating film around the storage electrode is removed to expose the surface of the storage electrode. The semiconductor device fabrication method according to the present invention is applicable to, e.g., semiconductor devices including fin capacitors.

What is claimed is:

1. A method for fabricating a semiconductor device comprising the steps of:

forming a wiring above a substrate, the wiring having a first insulating film formed on an upper surface and a side surface thereof;

forming a second insulating film above the substrate and the wiring;

forming a third insulating film on the second insulating film, the third insulating film having etching characteristics different from those of the second insulating film;

forming a contact hole at least in the second insulating film and the third insulating film;

forming a conductor plug inside the contact hole;

forming a fourth insulating film on the third insulating film and the conductor plug, the fourth insulating film having etching characteristics different from those of the second insulating film;

forming an opening in the third insulating film and the fourth insulating film in a region including a region with the conductor plug formed in;

forming a storage electrode on an inside surface of the opening and connected to the conductor plug on an upper surface and a side surface of the conductor plug; and etching the third insulating film and the fourth insulating film with the second insulating film as an etching stopper.

2. A method for fabricating a semiconductor device according to claim 1, wherein in the step of forming the contact hole, the contact hole is formed by self-alignment with the wiring.

3. A method for fabricating a semiconductor device according to claim 1, wherein the step of forming the contact hole includes a step of etching the third insulating film at a high selection ratio with respect to the second insulating film and a step of etching the second insulating film exposed in the contact hole.

4. A method for fabricating a semiconductor device according to claim 2, wherein the step of forming the contact hole includes a step of etching the third insulating film at a high selection ratio with respect to the second insulating film and a step of etching the second insulating film exposed in the contact hole.

5. A method for fabricating a semiconductor device according to claim 1, wherein in the step of forming the conductor plug, the conductor plug having a recess in an upper surface thereof is formed.

6. A method for fabricating a semiconductor device according to claim 1, wherein in the step of forming the contact hole, the contact hole reaches a source/drain diffusion layer of a transfer transistor formed on the base substrate, and in the step of forming the conductor plug, the conductor plug is formed in the contact hole, arriving at the source/drain diffusion layer.

7. A method for fabricating a semiconductor device according to claim 1, further comprising the steps of:

forming a capacitor, which includes the storage electrode as one electrode, and forming a bit line above the capacitor, the bit line being spacing from the capacitor.

* * * * *